US010611091B2

(12) United States Patent
Sterenthal et al.

(10) Patent No.: US 10,611,091 B2
(45) Date of Patent: Apr. 7, 2020

(54) ADDITIVE MANUFACTURING OF A THREE-DIMENSIONAL OBJECT

(71) Applicant: 3D Systems, Inc., Rock Hill, SC (US)

(72) Inventors: Roy Sterenthal, St. Shoman (IL); Kirill Volchek, St. Kiriat Ono (IL)

(73) Assignee: 3D Systems, Inc., Rock Hill, SC (US)

( * ) Notice: Subject to any disclaimer, the term of this patent is extended or adjusted under 35 U.S.C. 154(b) by 337 days.

(21) Appl. No.: 15/691,853

(22) Filed: Aug. 31, 2017

(65) Prior Publication Data

US 2018/0056594 A1 Mar. 1, 2018

Related U.S. Application Data

(60) Provisional application No. 62/382,543, filed on Sep. 1, 2016, provisional application No. 62/434,136, filed on Dec. 14, 2016.

(51) Int. Cl.
| | |
|---|---|
| *B29C 64/40* | (2017.01) |
| *B29C 64/393* | (2017.01) |
| *B29C 64/386* | (2017.01) |
| *B33Y 10/00* | (2015.01) |
| *B33Y 30/00* | (2015.01) |
| *B33Y 50/02* | (2015.01) |
| *G06F 17/50* | (2006.01) |
| *B33Y 50/00* | (2015.01) |

(52) U.S. Cl.
CPC .......... *B29C 64/393* (2017.08); *B29C 64/386* (2017.08); *B29C 64/40* (2017.08); *B33Y 10/00* (2014.12); *B33Y 30/00* (2014.12); *B33Y 50/02* (2014.12); *G06F 17/50* (2013.01); *B33Y 50/00* (2014.12)

(58) Field of Classification Search
CPC ....... B29C 64/393; B29C 64/40; B33Y 10/00; B33Y 30/00; B33Y 50/02

USPC ........................................................ 264/497
See application file for complete search history.

(56) References Cited

U.S. PATENT DOCUMENTS

| | | |
|---|---|---|
| 2013/0171019 A1 | 7/2013 | Gessler et al. |
| 2014/0300017 A1 | 10/2014 | Wighton et al. |
| 2014/0336808 A1 | 11/2014 | Taylor et al. |
| 2016/0075087 A1 | 3/2016 | Manners |
| 2016/0136883 A1 | 5/2016 | Schmidt |

(Continued)

FOREIGN PATENT DOCUMENTS

| | | |
|---|---|---|
| EP | 1217438 | 6/2002 |
| EP | 2926982 | 10/2015 |

OTHER PUBLICATIONS

PCT International Search Report and Written Opinion for International Application No. PCT/US2017/049519, dated Dec. 7, 2017 (14 pages).

(Continued)

*Primary Examiner* — Christina A Johnson
*Assistant Examiner* — Xue H Liu

(57) ABSTRACT

A system is configured to form a three dimensional (3D) object having multiple zones within the three dimensional object. The zones differ from each other according to system operational parameters. The system is operable to perform a method including: (1) receiving a solid model file, (2) generating a shell of the 3D object based on the file, (3) dividing the shell into zones, (4) defining or selecting parameters for forming the zones, (5) forming layer data defining layers of the 3D object, and creating a tool path from the layer data including merging layer data for the zones.

18 Claims, 20 Drawing Sheets

(56) References Cited

U.S. PATENT DOCUMENTS

2016/0332259 A1 11/2016 Jones et al.
2016/0346840 A1 12/2016 Clark et al.

OTHER PUBLICATIONS

PCT International Search Report and Written Opinion for International Application No. PCT/US2017/049523, dated Dec. 8, 2017 (14 pages).

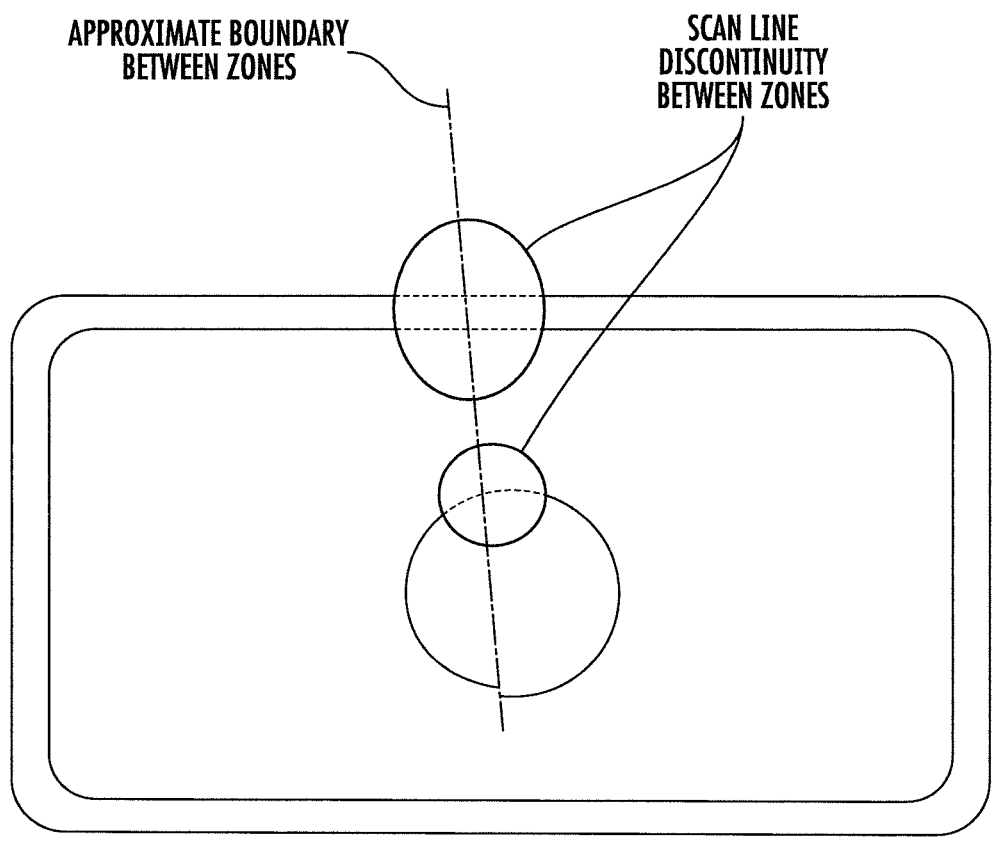
FIG. 15
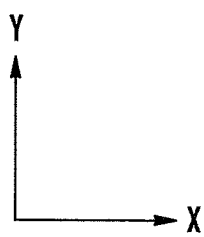

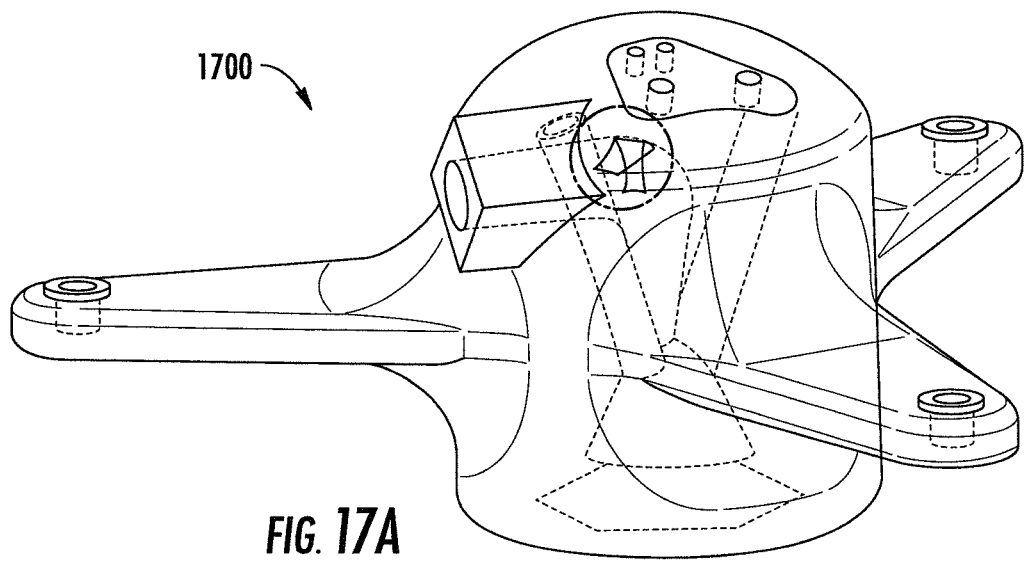
FIG. 17A
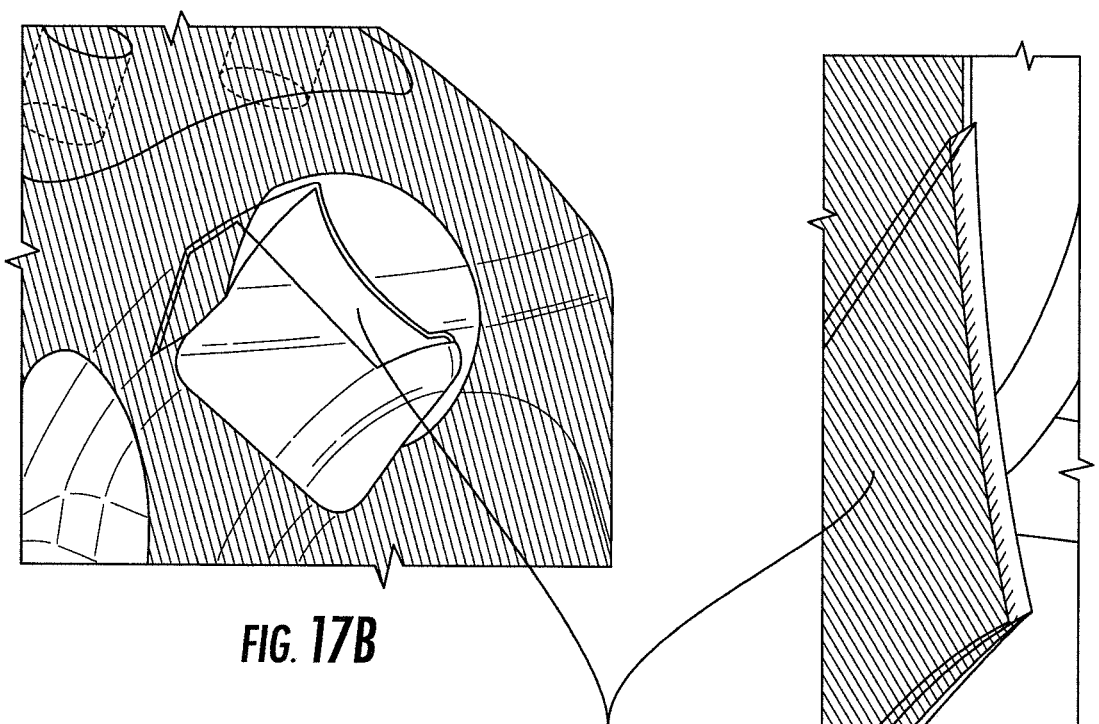
FIG. 17B
INDICATED ZONE IS SCANNED MULTIPLE TIMES FOR THE SAME POWDER LAYER AT A LOWER POWER.
FIG. 17C

ADDITIVE MANUFACTURING OF A THREE-DIMENSIONAL OBJECT

CROSS REFERENCE TO RELATED APPLICATIONS

This non-provisional patent application claims priority to U.S. Provisional Application Ser. No. 62/382,543, Entitled "IMPROVED ADDITIVE MANUFACTURING OF A THREE-DIMENSIONAL OBJECT" by Roy Sterenthal et al., filed on Sep. 1, 2016, incorporated herein by reference under the benefit of U.S.C. 119(e). This non-provisional patent application also claims priority to U.S. Provisional Application Ser. No. 62/434,136, Entitled "IMPROVED ADDITIVE MANUFACTURING OF A THREE-DIMENSIONAL OBJECT" by Roy Sterenthal, filed on Dec. 14, 2016, incorporated herein by reference under the benefit of U.S.C. 119(e).

TECHNOLOGICAL FIELD

The present disclosure relates generally to additive manufacturing and, in particular, to improved additive manufacturing of a three-dimensional object including features such as creation of support structures, design-aware or otherwise creating multiple zones of respective additive-manufacturing parameters, multi-exposure and/or use of multiple extruders, lasers or printheads.

BACKGROUND

In recent years, many different additive manufacturing techniques for the fast production of three-dimensional (3D) objects have been developed. Additive manufacturing and related variations thereof are sometimes referred to as 3D printing, solid imaging, solid freeform fabrication, rapid prototyping and manufacturing and the like. Additive manufacturing includes many different techniques for forming three-dimensional objects on a layer-by-layer basis from a build material utilizing layer or sliced data representing cross-sections of the objects. These techniques include, for example, extrusion-deposition or selective deposition modeling (SDM) techniques such as fused deposition modeling (FDM) and fused filament fabrication (FFF), stereolithography (SLA), polyjet printing (PJP), multi-jet printing (MJP), selective laser sintering (SLS), three-dimensional printing (3DP) techniques such as color-jet printing (CJP), and the like.

A number of additive manufacturing techniques form a three-dimensional object from a corresponding digital solid model, which is often provided by a computer-aided design system (this solid model at times referred to as a CAD model). The solid model may represent the object and its structural components by a collection of geometry. This solid model may be exported to another form that represents the closed-form surface geometry of the object, which at times may be referred to as a shell. In some examples, the shell of an object may take the form of a mesh of polygons (e.g., triangles), such as in the case of an STL (standard tessellation language) model or file. The shell of the object may then be sliced into layer data that defines layers of the shell. This layer data may be formatted into an appropriate language that describes a tool path for forming the object, which may be received by an additive manufacturing system to manipulate build material to form the object on a layer-by-layer basis.

Although existing additive manufacturing techniques are adequate, it is also generally desirable to improve on existing techniques.

BRIEF SUMMARY

Example implementations of the present disclosure are generally directed to an improved computing apparatus, method and computer-readable storage medium for additive manufacturing of a three-dimensional object including features such as creation of support structures, design-aware or otherwise creating multiple zones of respective additive-manufacturing parameters, multi-exposure and/or use of multiple extruders, lasers or printheads.

The present disclosure thus includes, without limitation, the following example implementations. Some example implementations provide a method of determining a type of support structure for a three-dimensional object formed by additive manufacturing, the method comprising receiving solid model of the three-dimensional object; performing a geometric analysis of the solid model to identify a region of the three-dimensional object requiring a support structure; performing stress and warping analyses of the solid model at the region so identified, the stress and warping analyses including one or more heuristic algorithms applied to the solid model, and excluding finite element analysis of a corresponding finite element model of the three-dimensional object; selecting a type of support structure to place at the region so identified, the type of support structure being selected from a plurality of types of support structure based on the stress and warping analyses so performed; and generating a shell of the three-dimensional object based on the solid model, and including the support structure at the region so identified and of the type so selected.

In some example implementations of the method of any preceding or any subsequent example implementation, or any combination thereof, the solid model is composed of a mesh of polygons, and performing the geometric analysis includes collecting neighboring polygons into the region of the three-dimensional object requiring a support structure.

In some example implementations of the method of any preceding or any subsequent example implementation, or any combination thereof, performing the stress and warping analyses includes a total stress analysis comprising: producing vectors for respective ones of the neighboring polygons, including for each neighboring polygon, tracing a plurality of equally-distributed rays from the neighboring polygon to an outer circumference of an up-facing hemisphere of a sphere centered on the neighboring polygon, and adding a plurality of vectors coincident with those of the plurality of rays that extend from the neighboring polygon through the solid model, the plurality of vectors extending from the neighboring polygon to an outer surface of the solid model, the plurality of vectors being added to produce the vector for the neighboring polygon; and determining a total stress value for the region from the vectors for the respective ones of the neighboring polygons.

In some example implementations of the method of any preceding or any subsequent example implementation, or any combination thereof, a subset of the neighboring polygons is on the boundary of the region, and performing the stress and warping analyses includes a corner stress analysis comprising: producing vectors for respective ones of the subset of the neighboring polygons, including for each neighboring polygon of the subset, tracing a plurality of equally-distributed rays from the neighboring polygon to an outer circumference of an up-facing hemisphere of a sphere centered on the neighboring polygon, and adding a plurality of vectors coincident with those of the plurality of rays that extend from the neighboring polygon through the solid model, the plurality of vectors extending from the neighboring polygon to a first of an outer surface of the solid model or the outer circumference of the up-facing hemisphere, the plurality of vectors being added to produce the vector for the neighboring polygon; and determining a corner stress value for the region from the vectors for the respective ones of the subset of the neighboring polygons.

In some example implementations of the method of any preceding or any subsequent example implementation, or any combination thereof, performing the stress and warping analyses includes a warping analysis comprising: producing vectors for respective ones of the neighboring polygons, including for each neighboring polygon, identifying a proximate region inside the solid model based on a normal from the neighboring polygon; tracing a plurality of equally-distributed rays from the proximate region to an outer circumference of a neighboring hemisphere of a sphere centered on the proximate region, adding a first plurality of vectors extending from the proximate region to an outer surface of the solid model, the first plurality of vectors being added to produce a first vector, adding a second plurality of vectors extending from the proximate region to a first of the outer surface of the solid model or an outer circumference of a neighboring hemisphere of a smaller, second sphere also centered on the proximate region, the second plurality of vectors being added to produce a second vector, and adding the first vector and the second vector to produce the vector for the neighboring polygon; and determining a warping value for the region from the vectors for the respective ones of the neighboring polygons.

In some example implementations of the method of any preceding or any subsequent example implementation, or any combination thereof, performing the stress and warping analyses includes determining values of total stress, corner stress and warping, and wherein selecting the type of support structure includes selecting the type of support structure based on the values of total stress, corner stress and warping.

In some example implementations of the method of any preceding or any subsequent example implementation, or any combination thereof, the solid model of the three-dimensional object is in a coordinate system with orthogonal axes including x- and y-axes, and a z-axis, height is defined by distance from a bottommost region of the solid model in the direction of the z-axis, and the values of total stress, corner stress and warping include an average total stress value, and wherein selecting the type of support structure includes selecting a skirt-type support structure in an instance in which the height of the region is less than or equal to a threshold height, and the average total stress value is above a threshold total stress value.

In some example implementations of the method of any preceding or any subsequent example implementation, or any combination thereof, selecting the type of support structure includes selecting a solid-type support structure in an instance in which the height of the region is greater than the threshold height but less than or equal to a second threshold height, and the average total stress value is above the threshold total stress value.

In some example implementations of the method of any preceding or any subsequent example implementation, or any combination thereof, generating the shell including the support structure includes generating the shell including the solid-type support structure with gaps defined therein based on the height of the region and the average total stress value.

In some example implementations of the method of any preceding or any subsequent example implementation, or any combination thereof, the values of total stress, corner stress and warping include a maximum corner stress value, and wherein selecting the type of support structure includes selecting a cone-type support structure or a solid-wall-type support structure in an instance in which the maximum corner stress value is above a threshold corner stress value.

In some example implementations of the method of any preceding or any subsequent example implementation, or any combination thereof, the values of total stress, corner stress and warping include an average warping value, and wherein selecting the type of support structure includes selecting a wall-type support structure in an instance in which the average warping value is below a threshold warping value.

In some example implementations of the method of any preceding or any subsequent example implementation, or any combination thereof, generating the shell including the support structure includes generating the shell including the wall-type support structure with spacing, pattern and teeth parameters that are parameterized according to the average warping value.

In some example implementations of the method of any preceding or any subsequent example implementation, or any combination thereof, the method further comprises: forming layer data defining a plurality of layers of the shell for use in forming the three-dimensional object and the support structure; and creating a tool path (sometimes referred to as a scan path) from the layer data for receipt by an additive manufacturing system configured to manipulate build material to form the three-dimensional object and the support structure on a layer-by-layer basis.

In some example implementations of the method of any preceding or any subsequent example implementation, or any combination thereof, the method further comprises divide the shell into zones and thereby form zones of the three-dimensional object; and defining or selecting a set of parameters for the additive manufacturing system to form each of the zones of the three-dimensional object, the set of parameters being different between the zones, and wherein creating the tool path includes merging the layer data for the zones in the tool path.

In some example implementations of the method of any preceding or any subsequent example implementation, or any combination thereof, the additive manufacturing system includes a laser configured to emit a beam onto build material to form the three-dimensional object on a layer-by-layer basis, and the set of parameters include values for one or more of beam power, beam offset, laser speed, laser time delay, laser acceleration parameters or laser focus.

In some example implementations of the method of any preceding or any subsequent example implementation, or any combination thereof, the shell of the three-dimensional object is in a coordinate system with orthogonal axes including x- and y-axes, and a z-axis, and wherein creating the tool path includes one or more of (a) adding continuity in the tool path for any beam offset that differs in the set of parameters between the zones, (b) including a finger joint in the tool path in the direction of the z-axis where the zones of the three-dimensional object are joined, (c) reorienting the tool path and/or hatch lines layer-per-layer in the directions of the x- and y-axes, or (d) offsetting a contour endpoint of the tool path for each zone.

In some example implementations of the method of any preceding or any subsequent example implementation, or any combination thereof, (b) including the finger joint includes alternately applying an offset to the zones in the directions of the x- and y-axes where the zones are joined.

In some example implementations of the method of any preceding or any subsequent example implementation, or any combination thereof, (c) reorienting the tool path includes reorienting the tool path to thereby reorient hatch lines in the three-dimensional object formed by the additive manufacturing system.

In some example implementations of the method of any preceding or any subsequent example implementation, or any combination thereof, (d) offsetting the contour includes adding approach and retract motions in the tool path at the contour end points of the tool path where the zones of the three-dimensional object are joined.

In some example implementations of the method of any preceding or any subsequent example implementation, or any combination thereof, dividing the shell into zones includes receiving user input to overlay three-dimensional volumes onto the shell, the three-dimensional volumes enclosing and thereby defining the zones of the three-dimensional object.

In some example implementations of the method of any preceding or any subsequent example implementation, or any combination thereof, the additive manufacturing system includes a laser configured to emit a beam onto build material to form the three-dimensional object on a layer-by-layer basis, wherein dividing the shell into zones includes defining a multi-exposure zone including another region of the shell and thereby the three-dimensional object to form without a support structure, the multi-exposure zone being associated with a set of parameters for the additive manufacturing system, the set of parameters being different between the multi-exposure zone and the three-dimensional object outside the multi-exposure zone, and wherein creating the tool path includes repeating the tool path within the multi-exposure zone.

In some example implementations of the method of any preceding or any subsequent example implementation, or any combination thereof, the set of parameters for the multi-exposure zone include a beam power and laser speed that decrease energy exposure relative to outside the multi-exposure zone.

In some example implementations of the method of any preceding or any subsequent example implementation, or any combination thereof, the additive manufacturing system includes first and second extruders configured to dispense respective build material to form respectively first and second zones of the three-dimensional object on a layer-by-layer basis, and wherein creating the tool path comprises creating first and second tool paths for respectively the first and second extruders, and includes merging the layer data for the first and second zones in the first and second tool paths.

In some example implementations of the method of any preceding or any subsequent example implementation, or any combination thereof, the additive manufacturing system includes first and second lasers configured to emit respective beams onto build material to form respectively first and second zones of the three-dimensional object on a layer-by-layer basis, and wherein creating the tool path comprises creating first and second tool paths for respectively the first and second lasers, and includes merging the layer data for the first and second zones in the first and second tool paths.

In some example implementations of the method of any preceding or any subsequent example implementation, or any combination thereof, the additive manufacturing system includes first and second printheads configured to deliver respective binder onto build material to form respectively first and second zones of the three-dimensional object on a layer-by-layer basis, and wherein creating the tool path comprises creating first and second tool paths for respectively the first and second printheads, and includes merging the layer data for the first and second zones in the first and second tool paths.

Some example implementations provide a method of creating multiple zones of parameters for a three-dimensional object formed by additive manufacturing, the method comprising receiving solid model of the three-dimensional object; generating a shell of the three-dimensional object based on the solid model; dividing the shell into zones and thereby form zones of the three-dimensional object; defining or selecting a set of parameters for the additive manufacturing system to form each of the zones of the three-dimensional object, the set of parameters being different between the zones; forming layer data defining a plurality of layers of the shell for use in forming the zones and thereby the three-dimensional object; and creating a tool path from the layer data, and including merging the layer data for the zones, for receipt by an additive manufacturing system configured to manipulate build material to form the three-dimensional object on a layer-by-layer basis.

In some example implementations of the method of any preceding or any subsequent example implementation, or any combination thereof, the additive manufacturing system includes a laser configured to emit a beam onto build material to form the three-dimensional object on a layer-by-layer basis, and the set of parameters include values for one or more of beam power, beam offset, laser speed, laser time delay, laser acceleration parameters or laser focus.

In some example implementations of the method of any preceding or any subsequent example implementation, or any combination thereof, the shell of the three-dimensional object is in a coordinate system with orthogonal axes including x- and y-axes, and a z-axis, and wherein creating the tool path includes one or more of (a) adding continuity in the tool path for any beam offset that differs in the set of parameters between the zones, (b) including a finger joint in the tool path in the direction of the z-axis where the zones of the three-dimensional object are joined, (c) reorienting the tool path layer-per-layer in the directions of the x- and/or y-axes, or (d) offsetting a contour endpoint of the tool path for each zone.

In some example implementations of the method of any preceding or any subsequent example implementation, or any combination thereof, (b) including the finger joint includes alternately applying an offset to the zones in the directions of the x- and/or y-axes where the zones are joined.

In some example implementations of the method of any preceding or any subsequent example implementation, or any combination thereof, (c) reorienting the tool path includes reorienting the tool path to thereby reorient hatch lines in the three-dimensional object formed by the additive manufacturing system.

In some example implementations of the method of any preceding or any subsequent example implementation, or any combination thereof, (d) offsetting the contour includes adding approach and retract motions in the tool path at the contour end points of the tool path where the zones of the three-dimensional object are joined.

In some example implementations of the method of any preceding or any subsequent example implementation, or any combination thereof, defining the sets of parameters includes receiving user input to overlay three-dimensional volumes onto the shell, the three-dimensional volumes enclosing and thereby defining the zones of the three-dimensional object.

In some example implementations of the method of any preceding or any subsequent example implementation, or any combination thereof, the additive manufacturing system includes a laser configured to emit a beam onto build material to form the three-dimensional object on a layer-by-layer basis, wherein dividing the shell into zones includes defining a multi-exposure zone including another region of the shell and thereby the three-dimensional object to form without a support structure, the multi-exposure zone being associated with a set of parameters for the additive manufacturing system, the set of parameters being different between the multi-exposure zone and the three-dimensional object outside the multi-exposure zone, and wherein creating the tool path includes repeating the tool path within the multi-exposure zone.

In some example implementations of the method of any preceding or any subsequent example implementation, or any combination thereof, the set of parameters for the multi-exposure zone include a beam power and laser speed that decrease energy exposure relative to outside the multi-exposure zone.

In some example implementations of the method of any preceding or any subsequent example implementation, or any combination thereof, the additive manufacturing system includes first and second extruders configured to dispense respective build material to form respectively first and second zones of the three-dimensional object on a layer-by-layer basis, and wherein creating the tool path comprises creating first and second tool paths for respectively the first and second extruders, and includes merging the layer data for the first and second zones in the first and second tool paths.

In some example implementations of the method of any preceding or any subsequent example implementation, or any combination thereof, the additive manufacturing system includes first and second lasers configured to emit respective beams onto build material to form respectively first and second zones of the three-dimensional object on a layer-by-layer basis, and wherein creating the tool path comprises creating first and second tool paths for respectively the first and second lasers, and includes merging the layer data for the first and second zones in the first and second tool paths.

In some example implementations of the method of any preceding or any subsequent example implementation, or any combination thereof, the additive manufacturing system includes first and second printheads configured to deliver respective binder onto build material to form respectively first and second zones of the three-dimensional object on a layer-by-layer basis, and wherein creating the tool path comprises creating first and second tool paths for respectively the first and second printheads, and includes merging the layer data for the first and second zones in the first and second tool paths.

Some example implementations provide a computing apparatus for determining a type of support structure for a three-dimensional object formed by additive manufacturing, the computing apparatus comprising a processor and a memory storing executable instructions that in response to execution by the processor cause the computing apparatus to at least perform the method of any preceding example implementation, or any combination thereof.

Some example implementations provide a computing apparatus for creating multiple zones of parameters for a three-dimensional object formed by additive manufacturing, the computing apparatus comprising a processor and a memory storing executable instructions that in response to execution by the processor cause the computing apparatus to at least perform the method of any preceding example implementation, or any combination thereof.

Some example implementations provide a computer-readable storage medium for determining a type of support structure for a three-dimensional object formed by additive manufacturing. The computer-readable storage medium is non-transitory and has computer-readable program code portions stored therein that, in response to execution by processing circuitry, cause a computing apparatus to at least perform the method of any preceding example implementation, or any combination thereof.

Some example implementations provide a computer-readable storage medium for creating multiple zones of parameters for a three-dimensional object formed by additive manufacturing. The computer-readable storage medium is non-transitory and has computer-readable program code portions stored therein that, in response to execution by processing circuitry, cause a computing apparatus to at least perform the method of any preceding example implementation, or any combination thereof.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as intended, namely to be combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

FIG. 15 illustrates a difference in contour that may result from multiple zones without correction according to an example implementation;

FIG. 17A illustrates a shell including an internal region for creation of a zone having particular parameters to implement multi-exposure to avoid a support structure therein, according to an example implementation;

FIG. 17B illustrates detail taken from FIG. 17A;

FIG. 17C illustrates detail taken from FIG. 17B;

DETAILED DESCRIPTION

Figure 1:
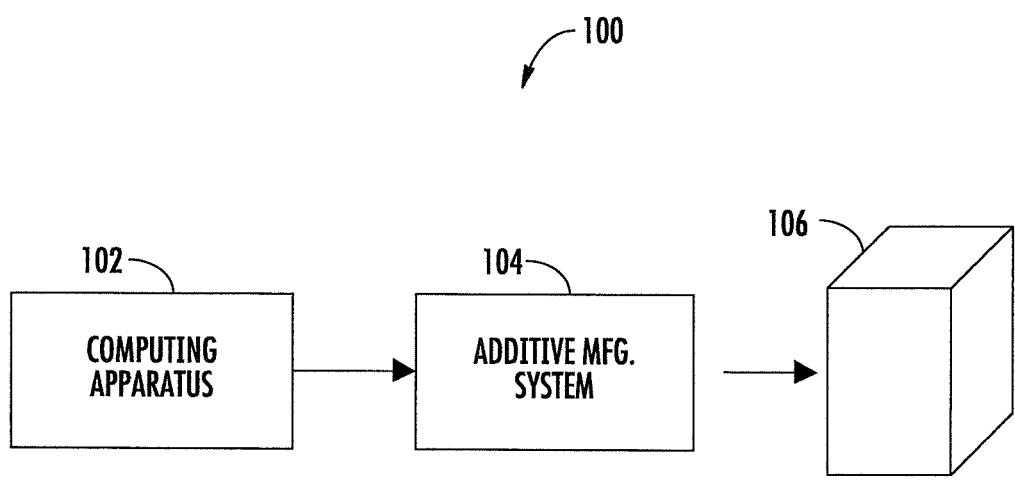
FIG. 1 is an illustration of a system including a computing apparatus and additive manufacturing system, in accordance with example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, for example, reference may be made herein to quantitative measures, values, relationships or the like (e.g., planar, coplanar, perpendicular). Unless otherwise stated, any one or more if not all of these may be absolute or approximate to account for acceptable variations that may occur, such as those due to engineering tolerances or the like. Like reference numerals refer to like elements throughout.

Example implementations of the present disclosure relate generally to additive manufacturing. Referring now to FIG. 1, a system 100 is illustrated according to example implementations of the present disclosure. The system may include any of a number of different apparatuses, subsystems and the like for performing one or more functions or operations. As shown, for example, the system may include a computing apparatus 102 and an additive manufacturing system 104. The computing apparatus is generally configured to receive and prepare data for receipt by the additive manufacturing system, and from which the additive manufacturing system may be configured to manipulate build material to form a physical, tangible three-dimensional object 106.

Figure 4:
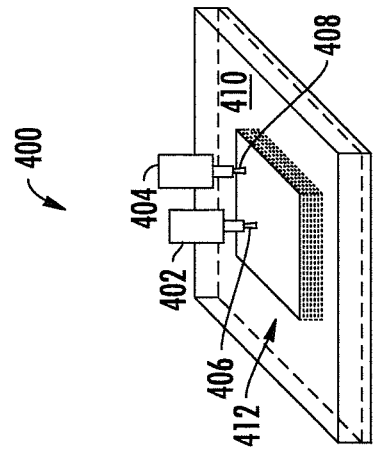
FIG. 4 illustrates a third embodiment of an additive manufacturing system which may correspond to the additive manufacturing system of FIG. 1.
Figure 3:
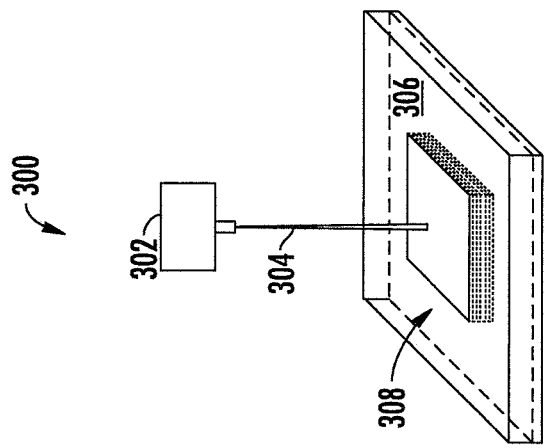
FIG. 3 illustrates a second embodiment of an additive manufacturing system which may correspond to the additive manufacturing system of FIG. 1.
Figure 2:
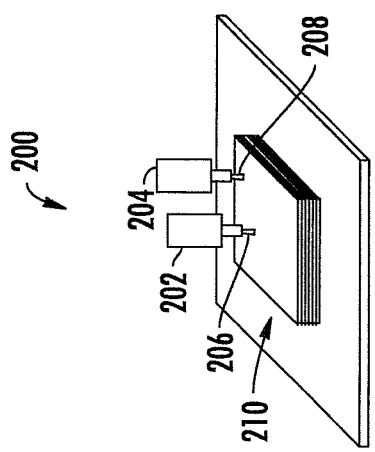
FIG. 2 illustrates a first embodiment of an additive manufacturing system which may correspond to the additive manufacturing system of FIG. 1.

The additive manufacturing system 104 may be configured to form the object 106 in accordance with any of a number of additive manufacturing techniques. Examples of suitable additive manufacturing techniques include extrusion-deposition or selective deposition modeling (SDM) techniques such as fused deposition modeling (FDM) and fused filament fabrication (FFF), stereolithography (SLA), polyjet printing (PJP), multi-jet printing (MJP), selective laser sintering (SLS), three-dimensional printing (3DP) techniques such as color-jet printing (CJP), and the like. FIGS. 2, 3 and 4 illustrate respective additive manufacturing systems 200, 300 and 400, which may in some examples correspond to the additive manufacturing system of FIG. 1.

FIG. 2 illustrates an additive manufacturing system 200 that may be configured to operate according to any of a number of different extrusion-based or selective deposition modeling (SDM) techniques such as fused deposition modeling (FDM), fused filament fabrication (FFF) or the like. As shown, the additive manufacturing system 200 may include one or more extruders 202, 204 configured to dispense respective build material 206, 208 to form a three-dimensional object 210 (e.g., object 106) on a layer-by-layer basis. Examples of suitable build materials include thermoplastics, high-density polyethylene (HDPE), eutectic metals, edible materials, rubber, modelling clay, plasticine, RTV silicone, porcelain, metal clay and the like.

FIG. 3 illustrates an additive manufacturing system 300 that may be configured to operate according to additive manufacturing techniques such as stereolithography (SLA), selective laser sintering (SLS) or the like. As shown, the additive manufacturing system 300 may include a laser 302 configured to emit a beam 304 onto build material 306 to form a three-dimensional object 308 (e.g., object 106) on a layer-by-layer basis. Here, examples of suitable build materials include photopolymers, thermoplastics, metal powders, ceramic powders and the like. In an alternative embodiment, element 302 can be an electron beam 304 generator.

FIG. 4 illustrates an additive manufacturing system 400 that may be configured to operate according to three-dimensional printing (3DP) techniques such as color-jet printing (CJP) or the like. As shown, the additive manufacturing system may include one or more printheads 402, 404 configured to deliver respective binder 406, 408 onto build material 410 to form a three-dimensional object 412 (e.g., object 106) on a layer-by-layer basis. Examples of suitable build materials include starch, gypsum plaster, sand, acrylic powder, sugar and the like, while examples of suitable binders include water or water-based liquids, calcium carbonate, cyanoacrylate, other types of liquids and the like.

Figure 5:
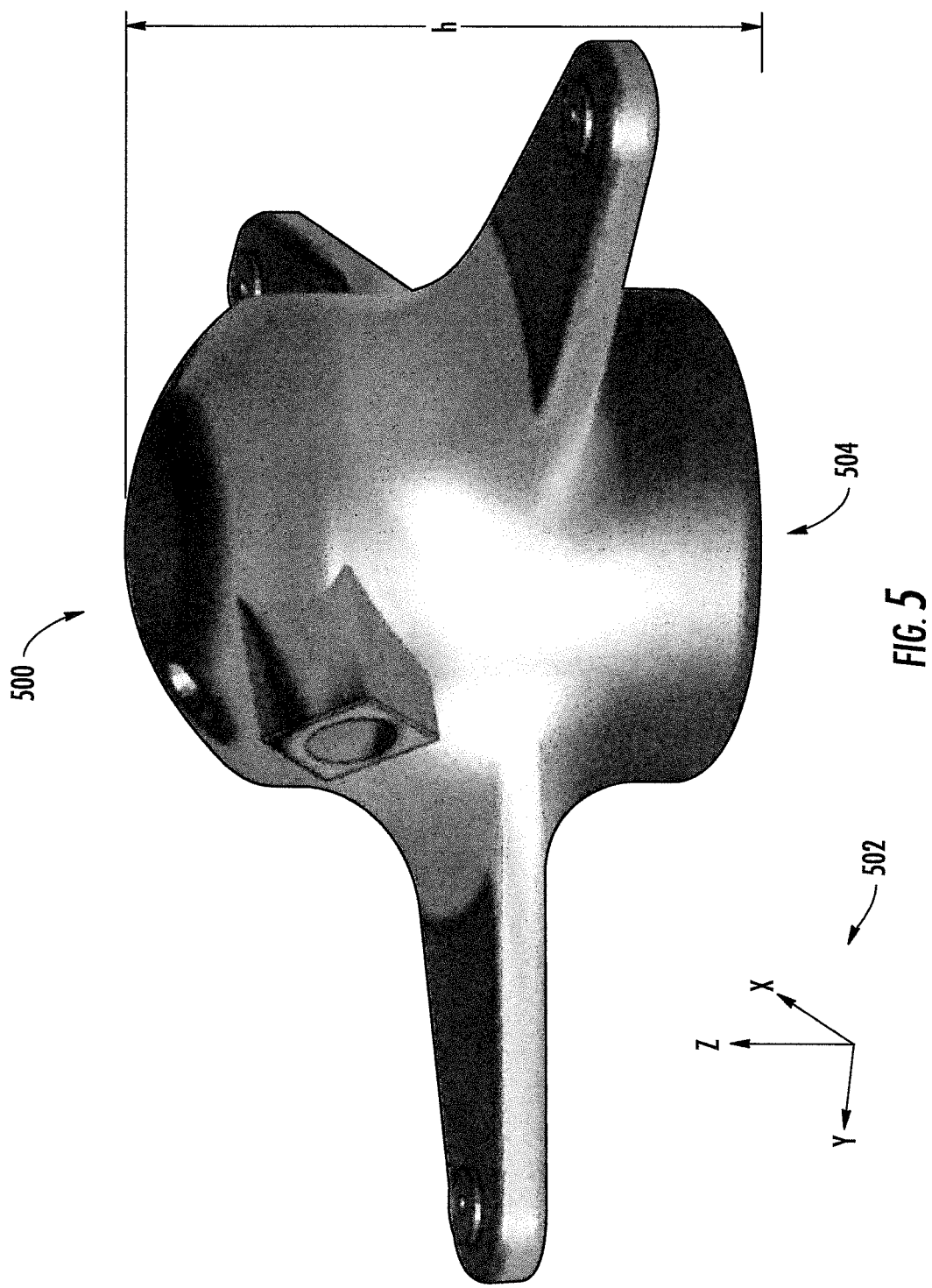
FIG. 5 illustrates a shell representation of a solid model of a three-dimensional object, in accordance with some example implementations.

Returning to FIG. 1, in some example implementations, the computing apparatus 102 may be used for determining a type of support structure for the three-dimensional object 106 formed by the additive manufacturing system 104. According to these example implementations, the computing apparatus may receive a solid model of the three-dimensional object. The solid model may be defined using b-rep (boundary representation) geometry definition or by any polygonal representation. FIG. 5 illustrates a shell 500 representation of a solid model of a three-dimensional object in a coordinate system 502 with orthogonal axes including x- and y-axes, and a z-axis, and in which height h may be defined by distance from a bottommost region 504 of the shell and correspondingly the solid model in the direction of the z-axis.

A. Support Structure Creation

In accordance with example implementations, the computing apparatus 102 may perform a geometric analysis of the solid model to identify a region of the three-dimensional object requiring a support structure. In some examples, the solid model is composed of a mesh of polygons (e.g., triangles). In these examples, the geometric analysis may include collecting neighboring polygons into the region of the three-dimensional object requiring a support structure. This may accomplished in some examples by identification of down-facing polygons and collecting neighboring ones of the down-facing polygons into the region of the three-dimensional object requiring a support structure. The down-facing polygons may be identified in a number of different manners such as those having a normal above a certain threshold angle.

In some examples, the computing apparatus 102 may further apply one or more heuristic algorithms to complete the region. A number of these algorithms are particularly useful for a solid model composed of a mesh of triangles but may also be applied to a mesh of other types of polygons.

One example of a suitable heuristic algorithm reformats the mesh to include equilateral triangles (polygons) to avoid long triangles or unequally-spread triangulation. Another example of a suitable heuristic algorithm optimizes identification of down-facing triangles based on neighboring triangles, and based on the neighboring triangles, more triangles may be added to the region, or groups of triangle may be merged or separated.

Another example of a suitable heuristic algorithm smooths the region to avoid a region with a zig-zag contour that may otherwise be created by the region including triangles that fall close to the threshold angle. This heuristic algorithm may smooth the region based on neighboring triangles and other geometric values.

In yet another example of a suitable heuristic algorithm, one or more filters may be applied to exclude less- or none-relevant areas such as small or thin areas that are not considered as local lowest geometry that are more likely to require a support structure. Neighboring triangles may be analyzed to exclude from a region any area that may not be relevant for purposes of support structure creation. Neighboring data may be analyzed in order to optimize the region such that looking ahead at the neighboring vertex data imply on the relevancy of the triangles on the border of the region or that may be included or not in the region. Sections of the region may be filtered as a consequence of the geometry direction and understanding of where supports are needed. Another filter may identify the bottommost region, and as appropriate, enlarge a collection of neighboring triangles to include those in and beyond the bottommost region to create a sufficient region for placement of a support structure.

In accordance with example implementations, different types of support structures may be used to reduce the effects of residual stresses in the three-dimensional object 106. Residual stresses are a major reason for the build failures, geometrical distortions and cracks in the three-dimensional object. Different types of support structures may be used to reduce these effects via heat removal and anchoring. Real physical simulations of the build process that may be accomplished by techniques such as finite element analysis (FEA), however, are known to be extremely computation intensive, and thus take tens of hours. The computing apparatus 102 of example implementations may use an alternative to the FEA approach, based on empirical knowledge to provide sufficient, approximate results within reasonable time, allowing users to minimize try and error cycle while preparing three-dimensional objects for manufacture.

More particularly, the computing apparatus 102 may select a particular type of support structure to place at the region so identified, and may do so according to stress and warping analyses of the solid model at the region. The stress and warping analyses may include a total stress analysis, corner stress analysis and/or warping analysis. The stress and warping analyses may include one or more heuristic algorithms applied to the solid model, and exclude finite element analysis of a corresponding finite element model of the three-dimensional object. The computing apparatus may then form layer data defining a plurality of layers of the shell for use in forming the three-dimensional object 106 and the support structure, and create a tool path from the layer data for receipt by the additive manufacturing system 104. As will be appreciated, the solid model typically describes the geometry of the three-dimensional object. The representation of the three-dimensional object described by the solid model is via the shell.

The stress and warping analyses may include volume distribution analyses on a number of heuristic assumptions.

For example, it may be assumed that heat distribution, transfer and absorption is a function of volume (and area) surrounding the region requiring a support structure. Another assumption may be that stress is concentrated around volume boundaries, which may enable a more selective analysis to improve performance of the analyses (reduce computation requirements). In some examples, three-dimensional data is analyzed, but the results may be visualized and analyses performed mostly on the boundary of the three-dimensional object, which may also reduce computation requirements.

The volume distribution analyses may be implemented as a ray tracing, where rays are equally distributed across a hemisphere, which adds a direction dimension to the analyses. A quantity of rays and density of region over which the analyses are performed may be defined via a "resolution" parameter that has several accuracy levels. The results may then be stored on (aligned with) the boundaries of the solid model of the three-dimensional object for further use.

Figure 6:
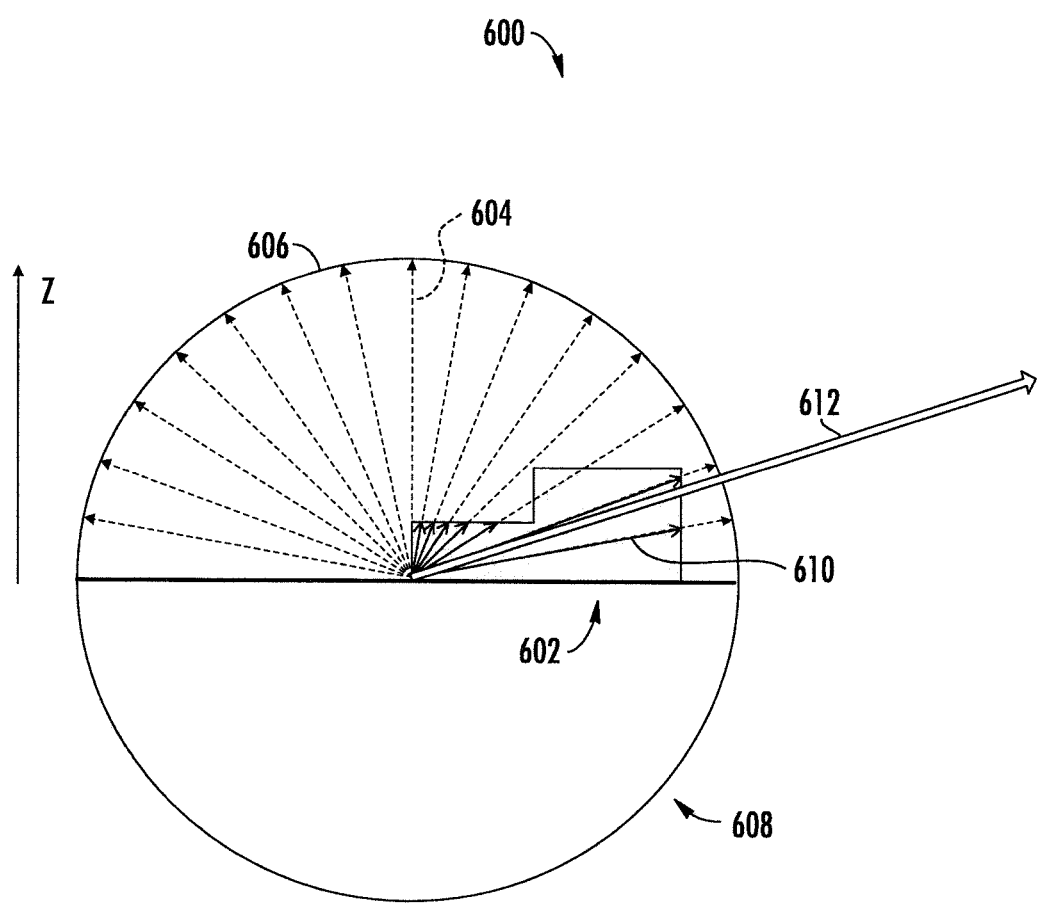
FIG. 6 illustrates aspects of a total stress analysis and a warping analysis for a solid model.

FIG. 6 illustrates aspects of a total stress analysis 600 for a solid model 602 according to some example implementations. In some examples, the total stress analysis includes production of vectors 604 for respective ones of the neighboring polygons. This may in turn include for each neighboring polygon, tracing a plurality of equally-distributed rays 604 from the neighboring polygon to an outer circumference of an up-facing hemisphere 606 of a sphere 608 centered on the neighboring polygon, and adding a plurality of vectors 610 coincident with those of the plurality of rays that extend from the neighboring polygon through the solid model. The vectors of the plurality of vectors extend from the neighboring polygon to an outer surface of the solid model, and are added to produce the vector 612 for the neighboring polygon. A total stress value for the region may then be determined from the vectors for the respective ones of the neighboring polygons.

Corner stress analysis may be implemented in a manner similar to total stress, but may focus on the neighboring polygons on the boundary of the region, and may limit the lengths of the vectors. According to a suitable corner stress analysis, a subset of the neighboring polygons is on the boundary of the region. The corner stress analysis may include production of vectors for respective ones of the subset of the neighboring polygons. This may include for each neighboring polygon of the subset, tracing a plurality of equally-distributed rays from the neighboring polygon to an outer circumference of an up-facing hemisphere of a sphere centered on the neighboring polygon, and adding a plurality of vectors coincident with those of the plurality of rays that extend from the neighboring polygon through the solid model. The vectors of the plurality of vectors extend from the neighboring polygon to a first of an outer surface of the solid model or the outer circumference of the up-facing hemisphere, and are added to produce the vector for the neighboring polygon. A corner stress value for the region may then be determined from the vectors for the respective ones of the subset of the neighboring polygons.

Figure 7:
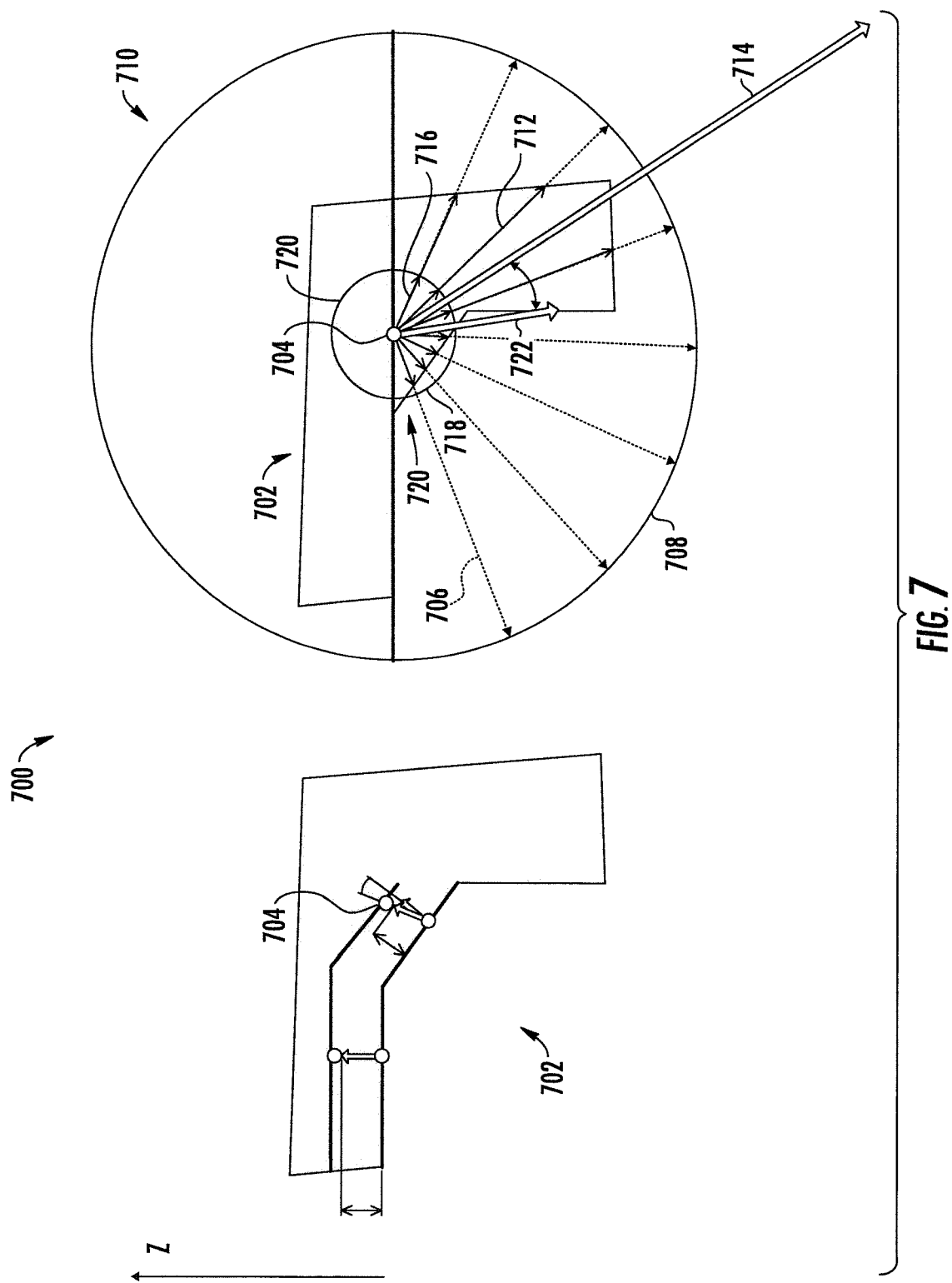
FIG. 7 illustrates aspects of a total stress analysis and a warping analysis for a solid model.

FIG. 7 illustrates aspects of a warping analysis 700 for a solid model 702 according to some example implementations. Similar to the other analyses, the warping analysis may include production of vectors for respective ones of the neighboring polygons. This may include for each neighboring polygon, identifying a proximate region 704 inside the solid model based on a normal from the neighboring polygon, and perhaps also some correction to improve the application to more vertical areas. The analysis may include tracing a plurality of equally-distributed rays 706 from the proximate region to an outer circumference of a neighboring hemisphere 708 of a sphere 710 centered on the proximate region.

As also shown in FIG. 7, a first plurality of vectors 712 extending from the proximate region to an outer surface of the solid model may be added to produce a first vector 714. Similarly, a second plurality of vectors 716 extending from the proximate region to a first of the outer surface of the solid model or an outer circumference of a neighboring hemisphere 718 of a smaller, second sphere 720 also centered on the proximate region may be added to produce a second vector 722. The first vector and the second vector may be added to produce the vector for the neighboring polygon, and a warping value for the region may be determined from the vectors for the respective ones of the neighboring polygons.

Regardless of the exact stress and warping analyses performed, the computing apparatus 102 may select a type of support structure to place at the region so identified, with the type of support structure being selected from a plurality of types of support structure based on the stress and warping analyses. This may include selection of the type of support structure based on the values of total stress, corner stress and warping. The computing apparatus may then generate a shell of the three-dimensional object based on the solid model, and including the support structure at the region so identified and of the type so selected.

Figure 8:
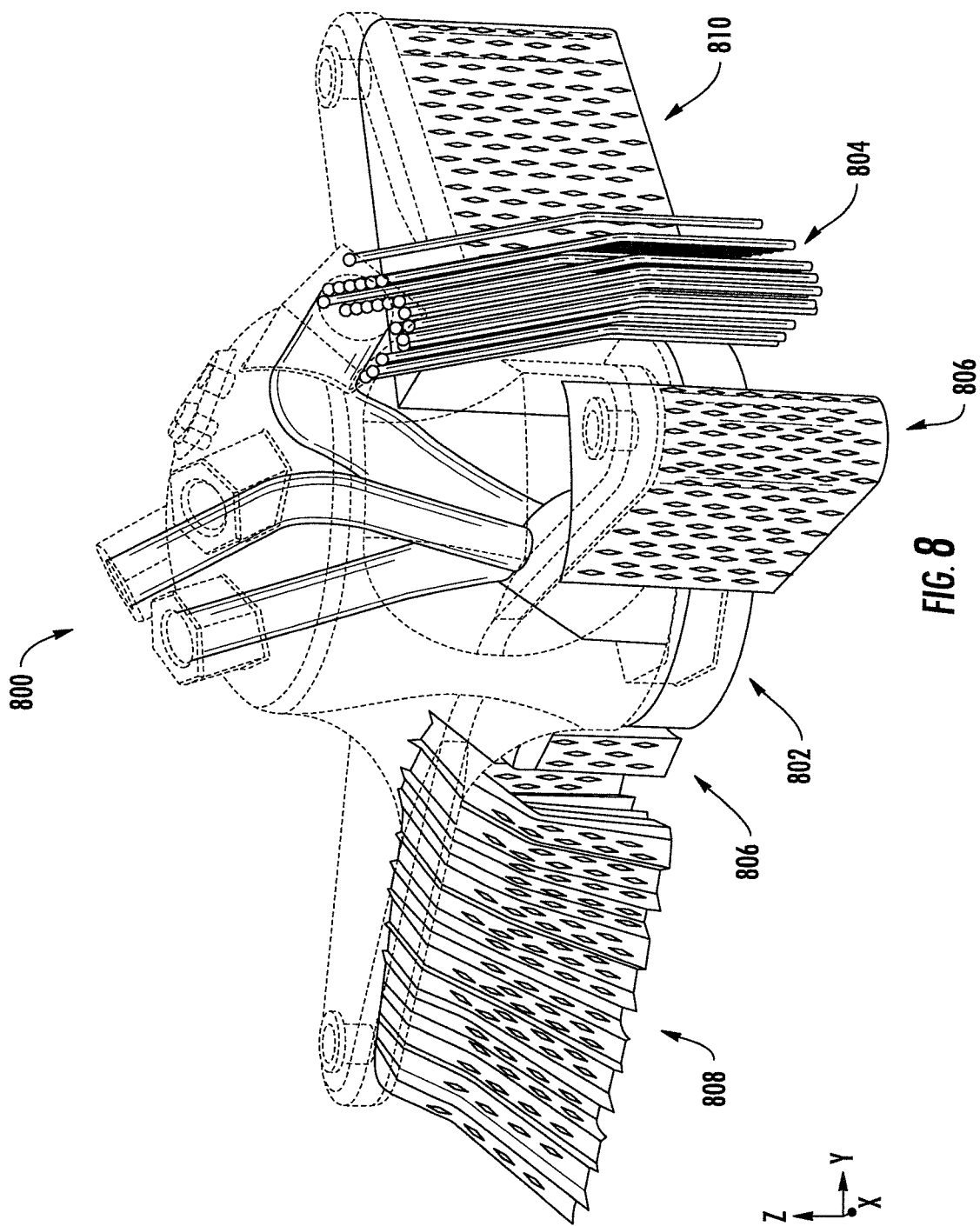
FIG. 8 illustrates a shell for a solid model similar to the solid model of FIG. 5, and including support structures of various types that may be selected according to example implementations.

Example types of suitable support structures include a skirt-type support structure, solid-type support structure, cone-type support structure, solid-wall-type support structure, wall-type support structure, skirt-type support structure, lattice-type support structure and the like. FIG. 8 illustrates a shell 800 for a solid model similar to the solid model 500 of FIG. 5, and including a solid-type support structure 802, cone-type support structure 804, solid-wall-type support structure 806, wall-type support structure 808 and lattice-type support structure 810.

In general, different types of support structures may be used for different purposes. Cone or solid-wall support structures, for example, may be used for anchoring, to prevent distortion or warping of the three-dimensional object 106 at specific points. A solid or similar support structure may be used to extend the geometry of the three-dimensional object down and thereby address total stress to make sure the accumulated stress of the three-dimensional object does not create distortions. In other examples, wall support structures may be used for heat removal in areas that accumulate heat, which may be the consequence of thin geometry in specific layers, or of massive sintering in the same area between multiple layers.

In accordance with example implementations, then, the computing apparatus 102 may select a skirt-type support structure in an instance in which the height of the region is less than or equal to a threshold height, and the average total stress value is above a threshold total stress value. This may correspond to a region physically close to a plate on which the three-dimensional object 106 is formed.

Figure 9:
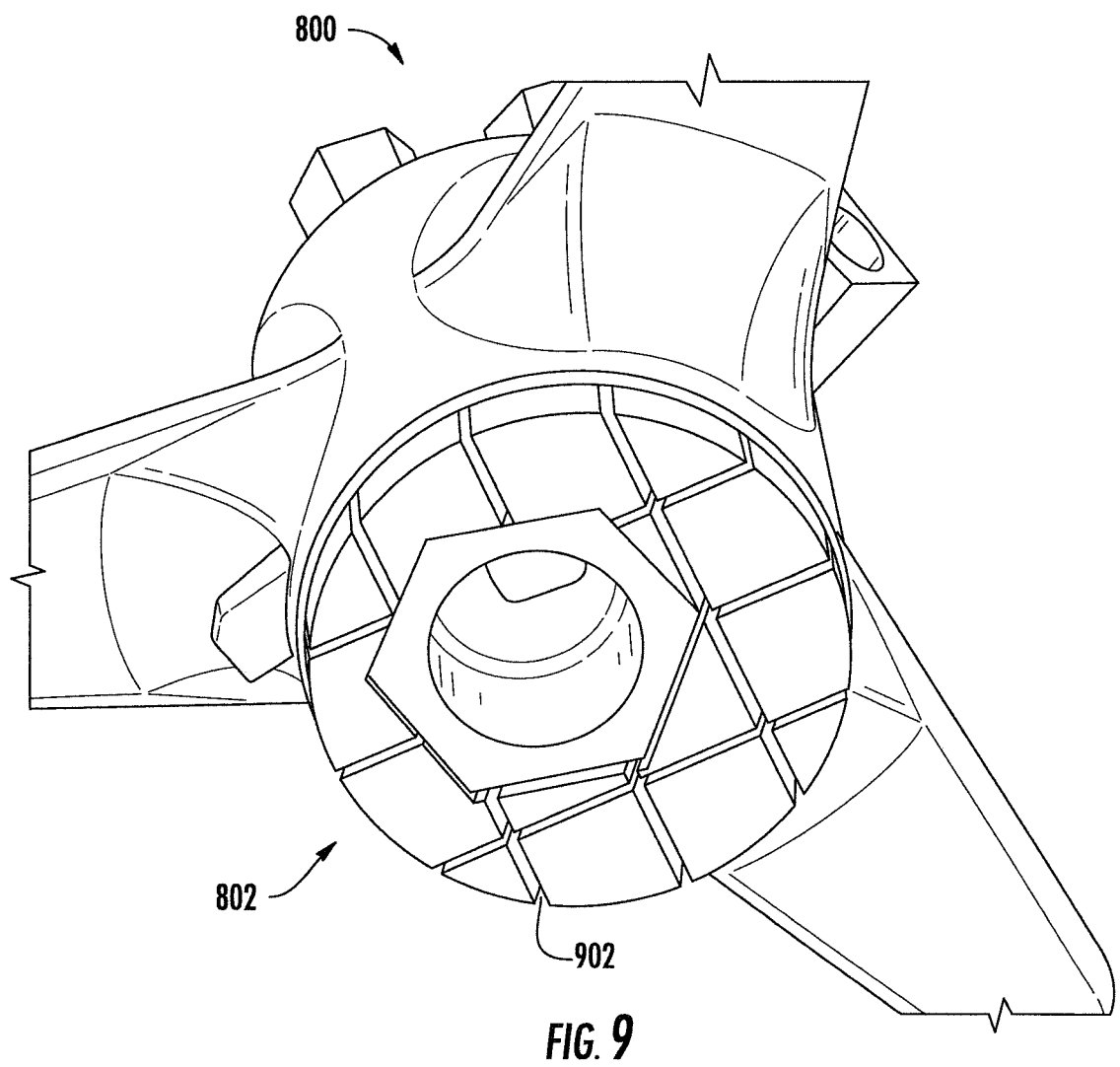
FIG. 9 illustrates the shell of FIG. 8 and highlights the solid-type support structure with gaps defined therein, according to example implementations.

The computing apparatus 102 may select a solid-type support structure in an instance in which the height of the region is greater than the threshold height but less than or equal to a second threshold height, and the average total stress value is above the threshold total stress value. This may further include the addition of gaps defined in the solid-type support structure based on the height of the region and the average total stress value. FIG. 9 illustrates the shell 800 of FIG. 8 and highlights the solid-type support structure 802 with gaps 902 defined therein.

The values of total stress, corner stress and warping include maximum values, average values or the like, and the type of support structure may be selected based on these values. For example, the computing apparatus 102 may select a cone-type support structure or a solid-wall-type support structure in an instance in which a maximum corner stress value is above a threshold corner stress value. Or the computing apparatus may select a wall-type support structure in an instance in which an average warping value is below a threshold warping value. Similar to the solid-type support structure, the wall-type support structure may include spacing, pattern and teeth parameters that are parameterized according to the average warping value.

The spacing, pattern and teeth parameters may be used to increase the ability of the support structure to remove heat while maintaining the ability to easily remove the structure from the resulting three-dimensional object 106. In this regard, where the average warping value is high, it may be desirable to increase the contact area between the three-dimensional object and wall-type support structure to achieve more optimal heat removal and distortion prevention. But since increasing the contact area may increase the difficulty in removing the support structure post-process, the computing apparatus 102 may optimize the contact area through the aforementioned parameters based on the average warping value.

B. Multiple Zones of Respective Parameters

According to another aspect of example implementations, the computing apparatus 102 may divide the shell into (multiple) zones and thereby form zones of the three-dimensional object 106 formed by the additive manufacturing system 104. According to this aspect, a set of parameters may be defined or selected for the additive manufacturing system to form each of the zones of the three-dimensional object, and the set of parameters may differ between the zones. In examples in which the additive manufacturing system includes a laser (e.g., additive manufacturing system 300 with laser 302), the sets of parameters may include values for one or more of beam power, beam offset, laser speed, laser time delay, laser acceleration parameters or laser focus, which may impact a melt pool that the build material may form as the three-dimensional object is formed.

Other examples of suitable parameters may include additional parameters such as layer thickness, hatching pattern (e.g., hexagon, parallel, checkmate or combinations thereof), number of boundary (contour) profiles, volume size of internal (core) geometry and the like. Layer thickness may impact the speed with which the three-dimensional object 106 is formed, with larger thicknesses being formed more quickly. Hatching pattern may vary for different volumes and geometry types, such as spiral continuous, hexagon with zig-zag core, and the like. The number of outer boundary profiles may impact surface quality, where increased quality may be achieved by forming multiple contours along the shape boundaries (inside offsetting). And volume size of internal (core) geometry may enable selection of advanced parameters for geometries with larger core volume.

Figure 10:
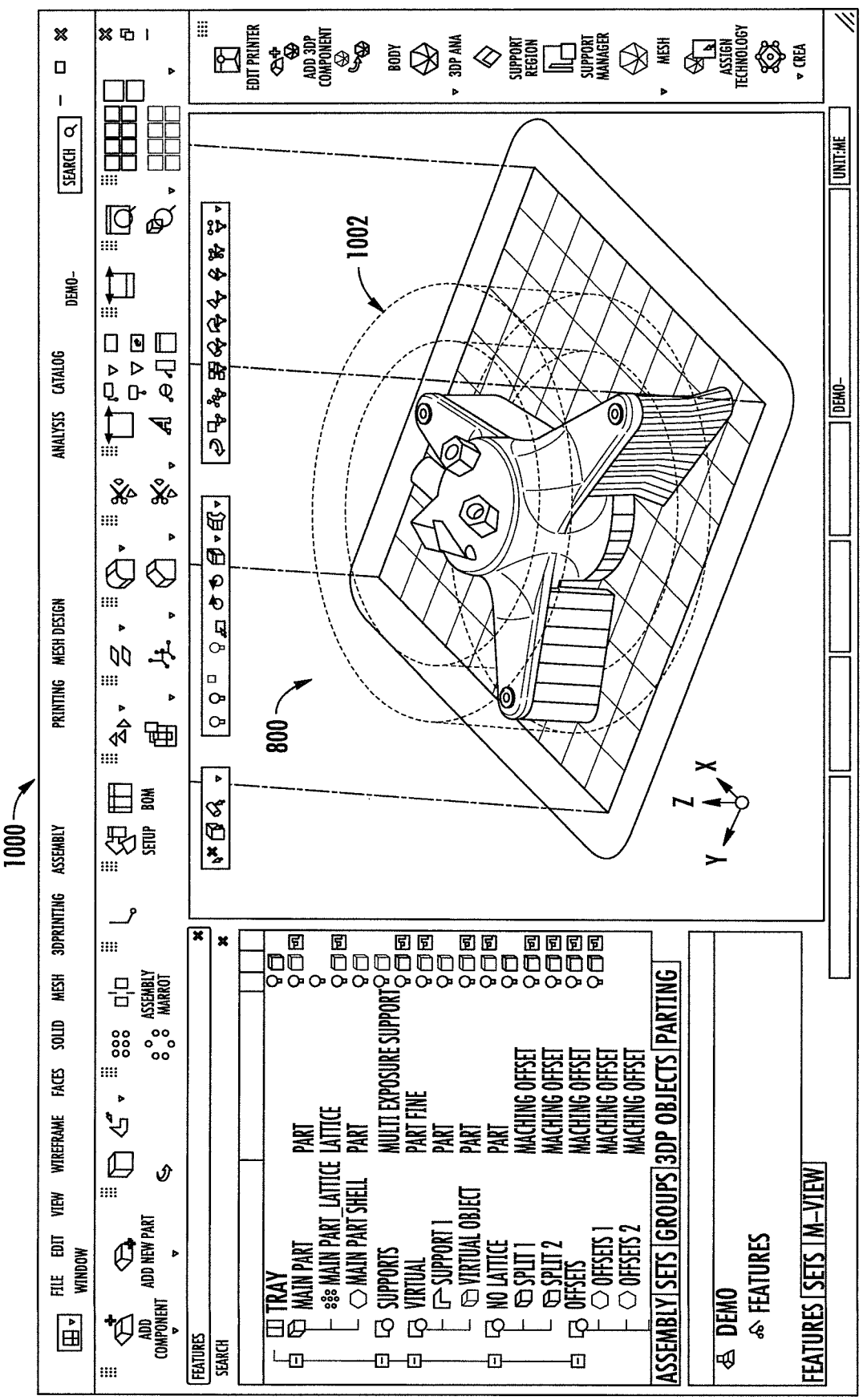
FIG. 10 illustrates a graphical user interface (GUI) that may be presented to a user according to example implementations, and from which various aspects may be carried out.

In some examples, the sets of parameters may be at least partially selected by user input to overlay three-dimensional volumes onto the shell. In these examples, the three-dimensional volumes may enclose and thereby define the zones of the three-dimensional object. The three-dimensional volumes, then, may be associated with respective ones of the sets of parameters for the additive manufacturing system 104 to form the zones. FIG. 10 illustrates a graphical user interface (GUI) 1000 that may be presented to a user according to example implementations, and in which the shell 800 of FIG. 8 may be presented. As shown, a three-dimensional volume 1002 (at times referred to as a virtual or non-printed object) may overlay the shell, and enclose and thereby define a zone of the three-dimensional object (another zone may be defined as that outside of the zone or any other zone). Zones may overlay one another, and a priority may be defined between them in such case.

In some examples, a zone and its parameters may be user defined or selected, either completely or through customization of appropriate defaults. The volumes that define the zones may be defined within the design environment and taken into account when the layer data and tool path are created. In some examples, a zone may be predefined or user defined but accompanied by predefined parameters for a particular type or manufacture of structure within the zone to be formed. In one example described in greater detail below, a zone may be automatically defined for multi-exposure in which support structures are to be avoided. In another example, a zone may be defined for excessive build material that will be later milled from the three-dimensional object 106, and for this zone, the parameters may describe a rough/fast manufacture of the structure within the zone that will be later removed. In another, similar example, zones may be defined to include support structures that will be later removed from the three-dimensional object, and for these zones, the parameters may describe a fast manufacture of the support structures within the zones that will be later removed. In yet another example, a zone may be defined for a structure optimized to contain a micro-structure lattice, and the parameters may be automatically assigned to optimize formation of the lattice. In yet another example, also described in greater detail below, zones may be automatically defined based on received thermal or residual stress analysis three-dimensional data (e.g., from finite-element-based analysis solutions) where one or more tool path parameters may be changed for better results of the three-dimensional object.

Figure 11:
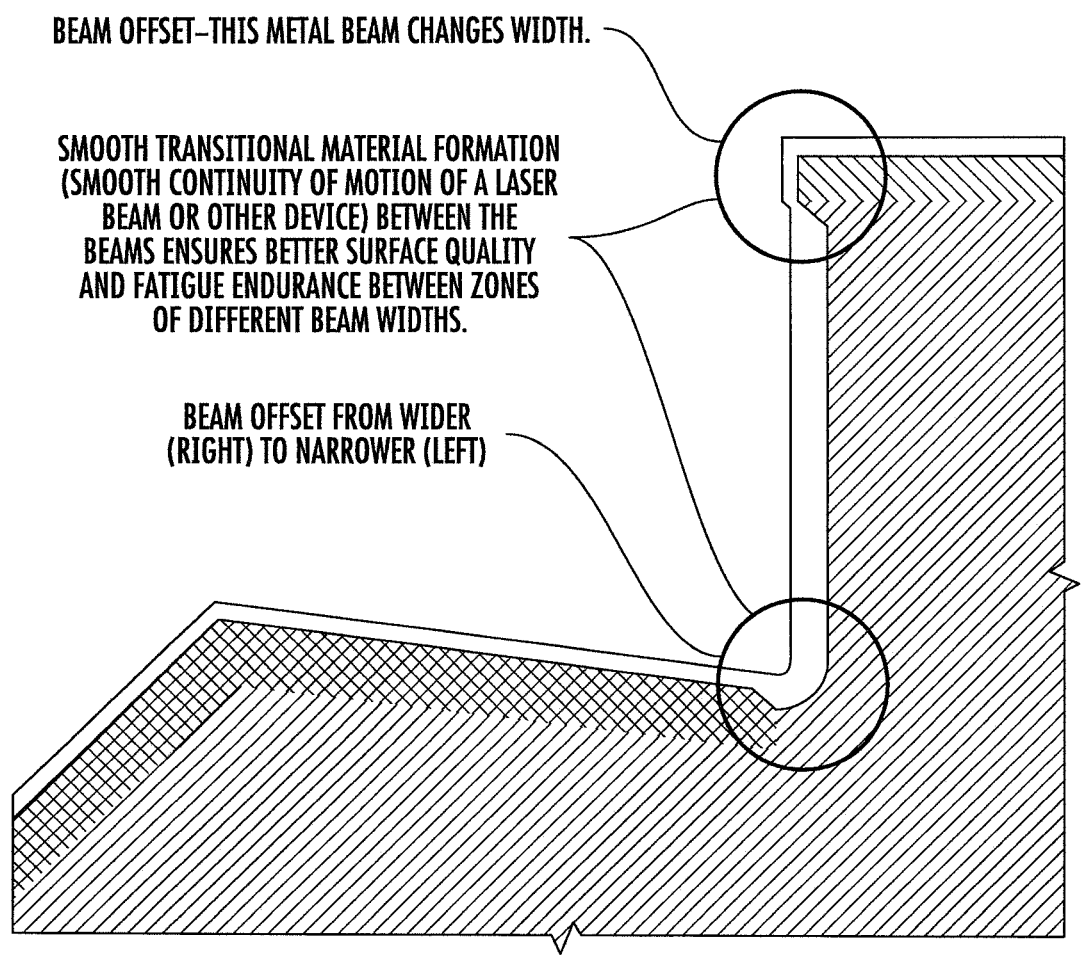
FIG. 11 illustrates a technique for merging zones with different parameters for additive manufacturing a three-dimensional object according to a first example implementation.

After the zones are defined, the computing apparatus 102 may merge the layer data for the zones in the tool path created for the additive manufacturing system 104. As shown in FIG. 11, for example, the computing apparatus may add continuity in the tool path for any beam offset that differs in the set of parameters between the zones, such as when moving from an offset of 50 microns to 100 microns.

Figure 12:
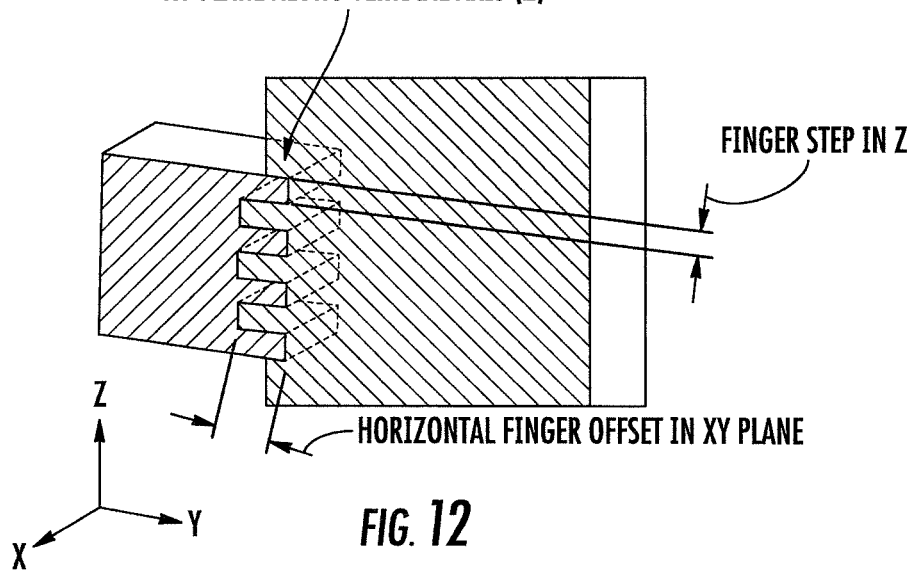
FIG. 12 illustrates a technique for merging zones with different parameters for additive manufacturing a three-dimensional object according to a second example implementation.
Figure 13A:
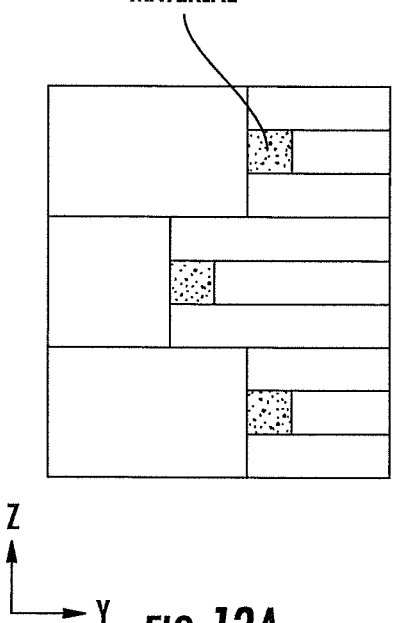
FIG. 13A illustrates a technique for merging zones with different parameters for additive manufacturing a three-dimensional object according to a third example implementation.
Figure 13B:
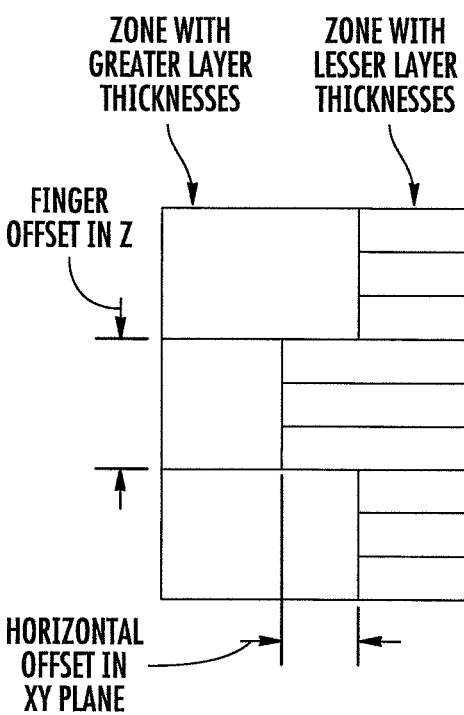
FIG. 13B illustrates a technique for merging zones with different parameters for additive manufacturing a three-dimensional object according to a fourth example implementation.

Additionally or alternatively, as shown in FIG. 12, the computing apparatus may include a finger joint in the tool path in the direction of the z-axis where the zones of the three-dimensional object are joined. This may include alternate application of a horizontal offset to the zones in the directions of the x- and/or y-axes where the zones are joined. In some examples, the vertical offset may account for a difference in layer thickness between the zones with the alternate application of the offset being based on the least common multiple between the layer thicknesses when the layer thicknesses vary from one zone to another. FIG. 13A illustrates a lesser ideal of the altering that may result in gaps or loose build material, which should be avoided by correct and as-needed application of the altering so it is synchronized between layer thicknesses as shown in FIG. 13B.

Figure 14A:
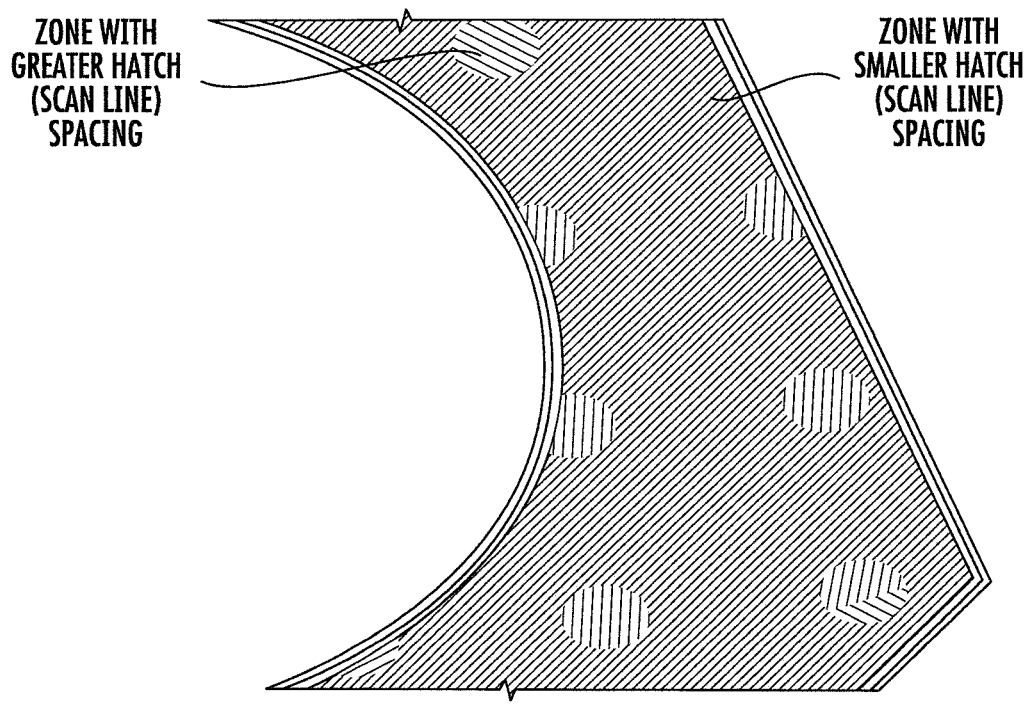
FIG. 14A illustrates a technique for merging zones with different parameters for additive manufacturing a three-dimensional object according to a fifth example implementation.
Figure 14B:
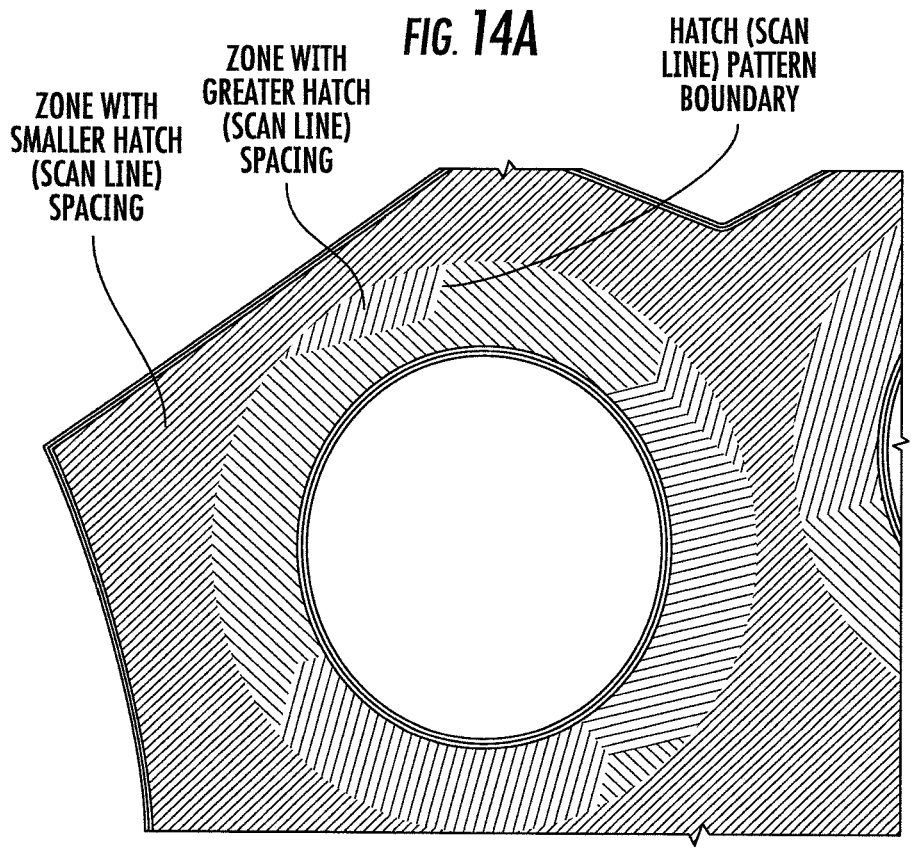
FIG. 14B illustrates a technique for merging zones with different parameters for additive manufacturing a three-dimensional object according to a sixth example implementation.

As shown in FIGS. 14A and 14B, the computing apparatus 102 may reorient the tool path layer-per-layer in the directions of the x- and y-axes, which may include reorienting the tool path to thereby reorient hatch lines in the three-dimensional object formed by the additive manufacturing system 104. Reorientation is a solution for avoiding weakness along the three-dimensional object 106 section line, and also starting point of the set of parameters for a particular zone that may otherwise create an undesired pattern within the three-dimensional object. This may be more if not most beneficial when creating many such section lines as part of different created zones with different sets of parameters. By changing the orientation of the tool path and thereby the hatch lines, weakness in the object that may otherwise result from repeating the same hatch lines may be avoided.

FIG. 15 illustrates a difference in contour that may result from multiple zones without correction. In some examples, then, the computing apparatus 102 may offset a contour endpoint of the tool path for each zone, which may include the addition of approach and retract motions in the tool path at the contour end points of the tool path where the zones of the three-dimensional object are joined. This may avoid visible line on the outer boundary surface, and small displacements of internal features.

Figure 16:
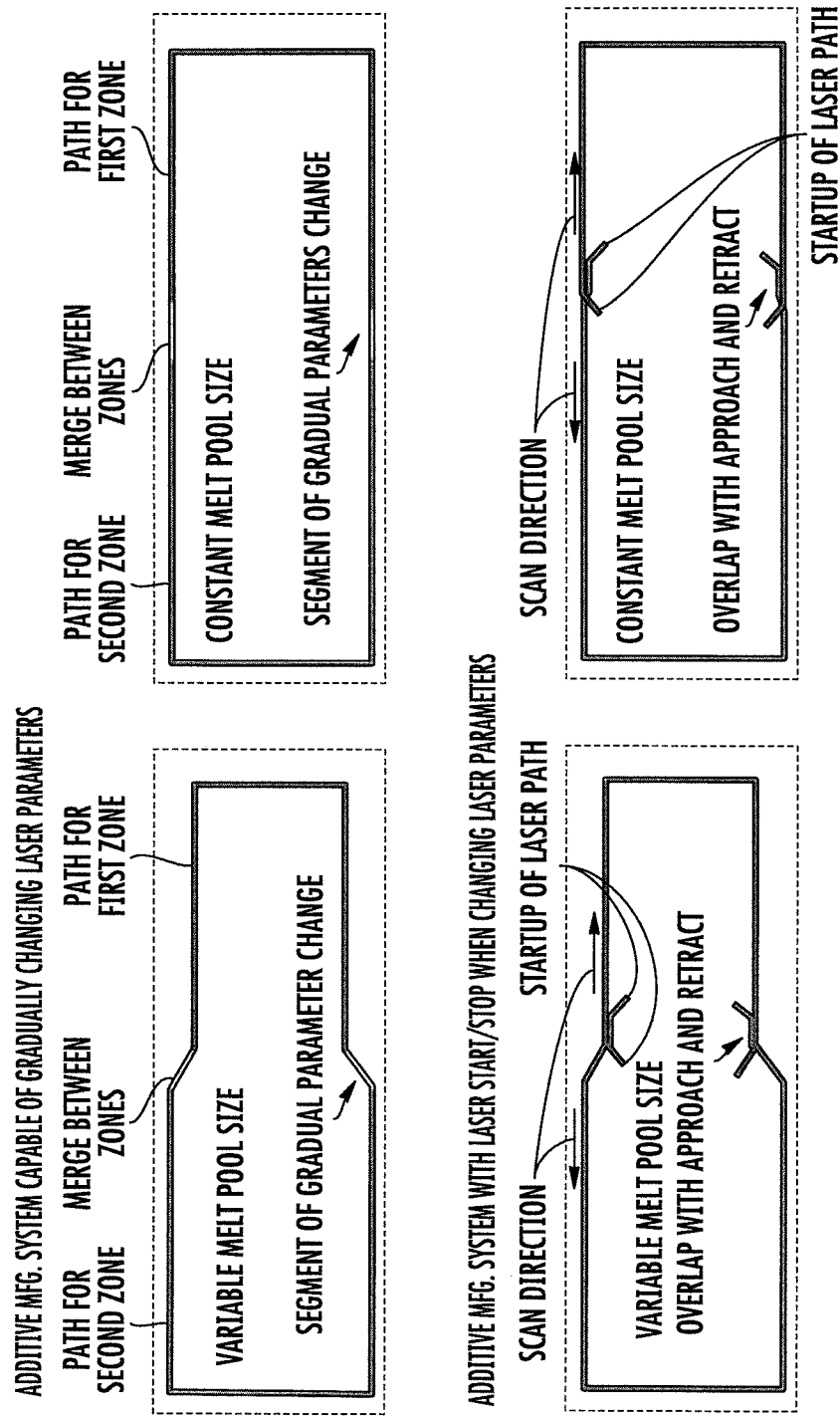
FIG. 16 illustrates exemplary techniques for merging zones to provide correction according to a example implementations.

As shown in FIG. 16 illustrates how continuity in the tool path may be added by gradual merge of different melt pool sizes, which may be similarly applied to contours or hatch lines. When the additive manufacturing system 104 is incapable of gradually changing the tool path, the computing apparatus 102 may automatically include approach and retract motions in the tool path, which may create a smooth transition between different beam offsets.

C. Multi-Exposure

In some aspects of example implementations of the present disclosure, a region of the solid model and corresponding three-dimensional object 106 may be identified where removal of support structures is likely problematic or impossible, which may be the case for some internal regions. To reduce if not minimize or otherwise avoid support structures, the computing apparatus 102 may create a multi-exposure zone with particular parameters to gradually solidify or reduce stress in the region. The parameters may create a state in which the build material forms the three-dimensional object in the multi-exposure zone with decreased or increased laser speed and beam power to achieve decreased energy exposure on the same path in the multi-exposure zone multiple times (e.g., 3 or 4 times) until reaching a desired result and moving on. In these aspects, in instances in which the three-dimensional object includes other zones, the layer data for this multi-exposure zone may be merged with those other zones, such as in a manner similar to that described above.

In some examples, then, division of the shell into zones may include definition of a multi-exposure zone including another region of the shell and thereby the three-dimensional object to form without a support structure. In these examples, the multi-exposure zone may be associated with a set of parameters for the additive manufacturing system to form the multi-exposure zone of the three-dimensional object. The set of parameters here may be different between the zone and the three-dimensional object outside the multi-exposure zone. In some examples in which the additive manufacturing system 104 includes a laser (e.g., additive manufacturing system 300 with laser 302), the set of parameters for the multi-exposure zone include a beam power and laser speed that decrease energy exposure relative to outside the zone. The tool path created by the computing apparatus may also repeat the tool path within the multi-exposure zone. FIGS. 17A, 17B and 17C illustrate a shell 1700 including an internal region for which the computing apparatus 102 may create a multi-exposure zone having particular parameters to enable the system 100 to avoid a support structure therein.

D. Tool Path Optimization for Temperature/Stress

In some aspects of example implementations of the present disclosure, zones may be automatically defined based on either or both thermal analysis or residual stress analysis, and used to optimize or otherwise change (from a default) or set (generally "set") one or more tool path parameters and thereby the tool path for better results of the three-dimensional object 106. Suitable analyses include real physical simulations of the build process by techniques such as FEA, with or without any support structures added to reduce possible displacements, plastic strain and heat. These support structures, as well as the plate on which the three-dimensional object is formed, and any other machining information may influence and be accounted for in the analyses.

In some examples, the thermal and residual stress analyses output respectively temperature data and stress data layer-by-layer or across all layers of the three-dimensional object 106. This data may be output in any of a number of different forms, such as temperature maps and stress maps, and may include a timeline of the temperature and stress as they accumulate over the simulated additive manufacturing process. In some examples, the stress data may be vector data including both a direction and magnitude.

In accordance with these aspects of example implementations of the present disclosure, a less desirable if not problematic region (one or more) of the solid model and corresponding three-dimensional object 106 may be identified from either or both the temperature data or stress data. In some examples, this region is one in which the temperature data indicates temperature above a threshold temperature, or the stress data indicates stress having a magnitude above a threshold stress or an undesirable direction. The region is identified by the computing apparatus 102, either automatically from either or both the temperature data or stress data, or through user input from a display of the temperature data or stress data such as respectively a temperature map or stress map.

To reduce if not minimize or otherwise avoid undesirable temperature or displacement caused by stress in the region so identified, the computing apparatus 102 may create a zone (one or more) in which one or more tool path parameters are set for this purpose. In some examples, the zone is created concurrent with and corresponds to the region identified either automatically by the computing apparatus, or through user input. In these aspects, in instances in which the three-dimensional object includes other zones, the layer data for this zone may be merged with those other zones (including a multi-exposure zone), such as in a manner similar to that described above.

The tool path parameters and thereby the tool path for the zone may be set in any of a number of different manners. To address undesirable temperature and/or displacement caused by stress, in some examples, tool path parameter(s) that define the hatching pattern or hatch lines are set to define the pattern, or set the length, orientation or order of the hatch lines (change, reorient or reorder if relative to a default) to reduce the temperature, or reduce (magnitude) or reorient (direction) displacement, in the zone. In a more specific example, the hatch lines are set to more evenly distribute them over layers (and thereby reduce temperature) in the zone. In another more specific example, the length, orientation or order of hatch lines is set to define shorter lines in a direction different from the direction of stress in the zone, as opposed to longer lines in the direction of stress in the zone. In any of these and other examples, the tool path parameter(s) may be set in addition to or in lieu of other parameters described above to achieve the desired effect.

Figure 18:
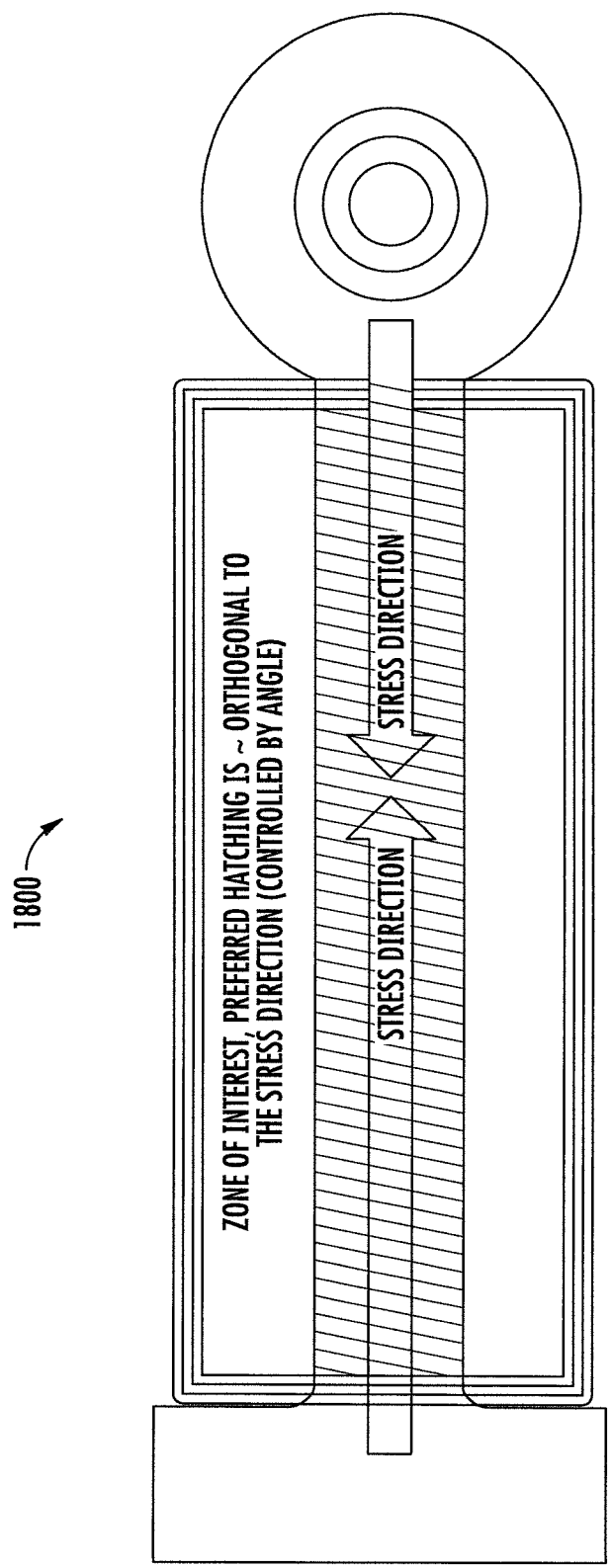
FIG. 18 illustrates a tool path optimization using thermal or residual stress analysis, according to example implementations.
Figure 19:
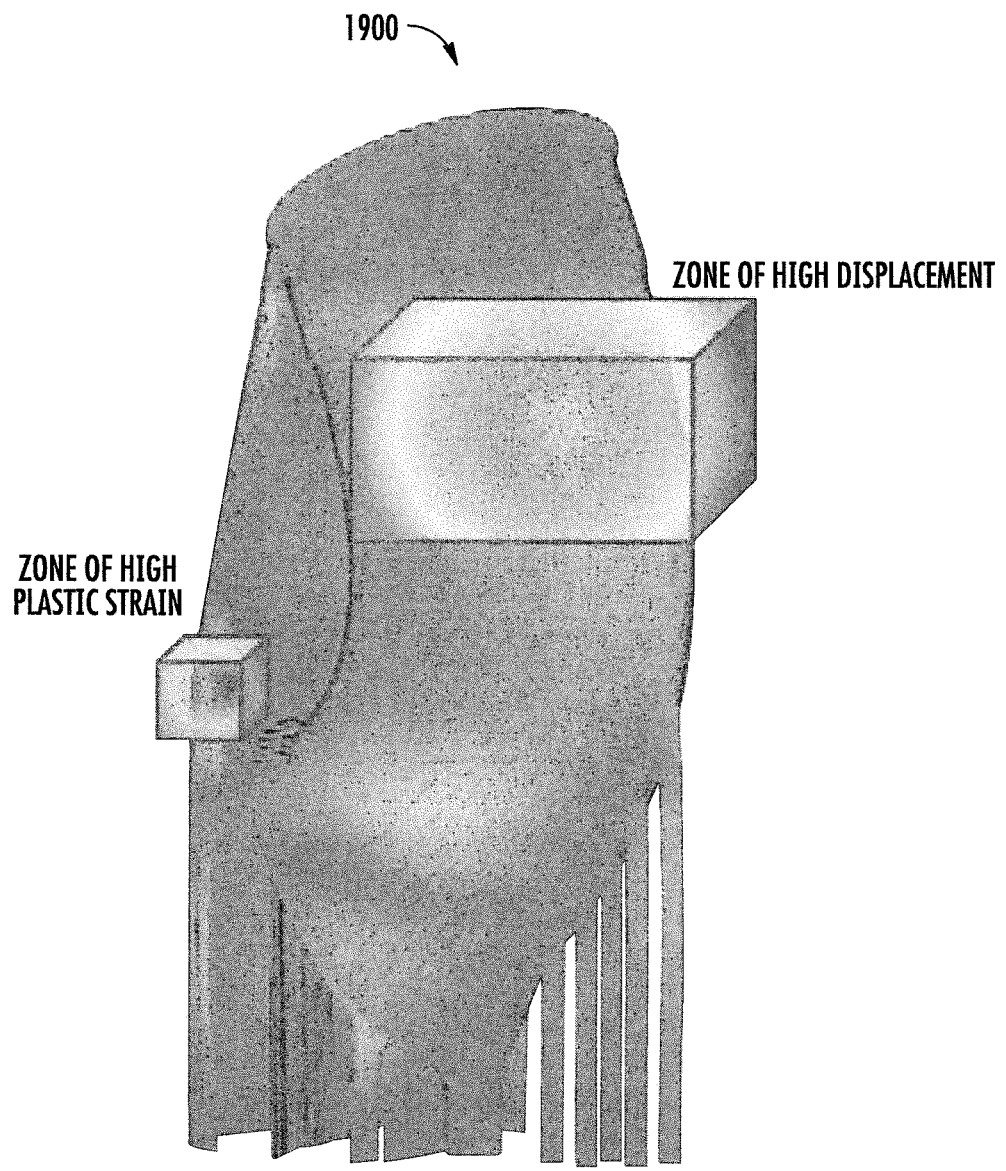
FIG. 19 illustrates different zones within an exemplary three dimensional object.

In some examples, then, division of the shell into zones may include definition of a zone including another region of the shell and thereby the three-dimensional object within which to set tool path parameter(s) to address undesirable temperature and/or stress in the region. In these examples, the tool path parameter(s) may be determined based on temperature data and/or stress data layer-by-layer or across all layers of the three-dimensional object 106, such as from FEA-based analysis/analyses. The tool path parameter(s) here may be different between the zone and the three-dimensional object outside the zone. FIG. 18 illustrates a top view of a shell 1800 including a region for which the computing apparatus 102 may create a zone having particular tool path parameter(s) to orient the hatch lines approximately orthogonal to the direction of stress in the three-dimensional object. FIG. 19 illustrates a shell 1900 including regions of high displacement and high plastic strain for which the computing apparatus 102 may create respective zones having particular tool path parameter(s) to address the displacement and stress, as described above.

E. Multiple Extruders, Lasers, Printheads

In some examples additive manufacturing system 104 may include and utilize multiple extruders, lasers or printheads to form the three-dimensional object 106. That is, in examples in which the additive manufacturing system 104 includes extruders (e.g., additive manufacturing system 200 with extruders 202, 204), the additive manufacturing system may include first and second extruders configured to dispense respective build material. Similarly, in some examples in which the additive manufacturing system includes a laser (e.g., additive manufacturing system 300 with laser 302), the additive manufacturing system may include first and second lasers configured to emit respective beams onto build material. Likewise, in some examples in which the additive manufacturing system includes printheads (e.g., additive manufacturing system 400 with printheads 402, 404), the additive manufacturing system may include first and second printheads configured to deliver respective binder onto build material.

Figure 20A:
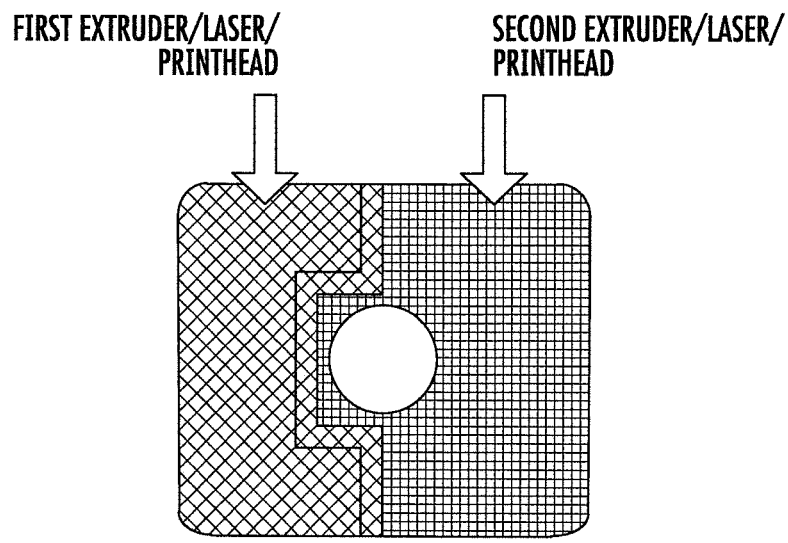
FIG. 20A illustrates a first exemplary division of a solid model, shell or melt pool between multiple extruders, lasers or printheads of an additive manufacturing system, according to an example implementation.
Figure 20B:
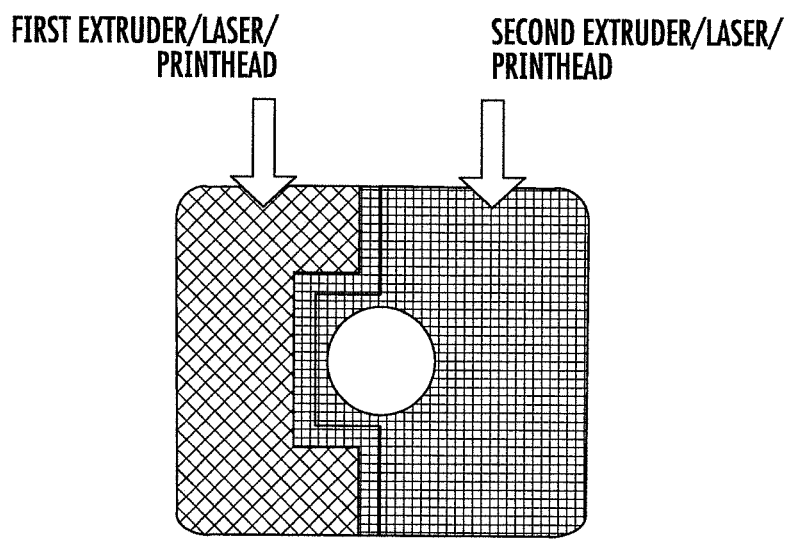
FIG. 20B illustrates a second exemplary division of a solid model, shell or melt pool between multiple extruders, lasers or printheads of an additive manufacturing system, according to an example implementation.

In these examples, the computing apparatus 102 may create first and second tool paths for respectively the first and second extruders, lasers or printheads, and merge the layer data for the first and second zones in the first and second tool paths. This may be accomplished in a manner similar to that described above, but may additionally address challenges in synchronization and calibration between the extruders, lasers or printheads, as well as laser stability issues between different lasers. The computing apparatus may automatically or with user input, divide the solid model or shell between the extruders, lasers or printheads in a manner that optimizes their use, such as minimizing the division crossing internal features, as shown in FIGS. 20A and 20B, and/or applying the same or similar merge techniques as described above. As shown in FIGS. 20A and 20B, a gap may be included to function as a somewhat demilitarized zone in which each of the extruders, lasers or printheads may operate. In some examples, the gap may be alternately covered by the extruders, lasers or printheads between layers (FIG. 20A for one layer, and FIG. 20B for another), with each of the extruders, lasers or printheads applying a respective hatch pattern. The system 100 may optimize the structure. It may be larger (leaving the system more freedom) or very narrow (specified tolerance value), and in some examples may be user controlled.

Figure 21:
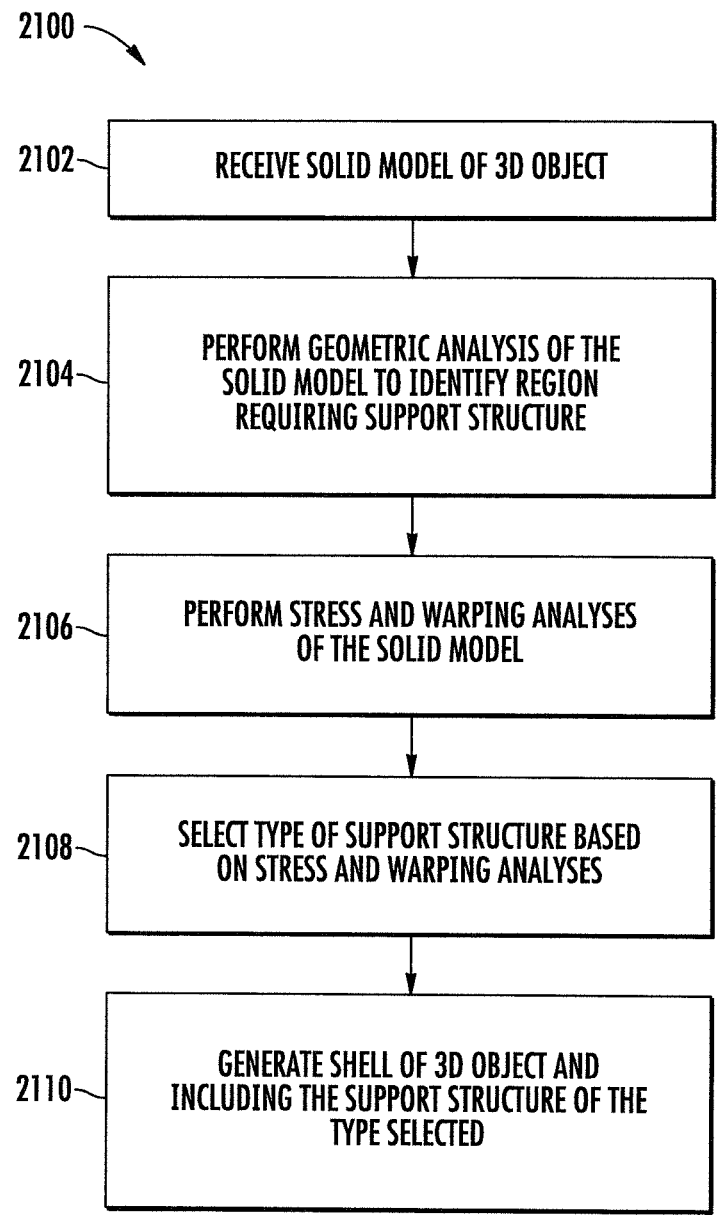
FIG. 21 is a flowchart illustrating various operations in a method of determining a type of support structure for a three-dimensional object formed by additive manufacturing, according to some example implementations.

FIG. 21 illustrates various operations in a method 2100 of determining a type of support structure for a three-dimensional object formed by additive manufacturing, according to some example implementations of the present disclosure. As shown in blocks 2102, 2104, the method includes receiving solid model of the three-dimensional object, and performing a geometric analysis of the solid model to identify a region of the three-dimensional object requiring a support structure. The method includes performing stress and warping analyses of the solid model at the region so identified, the stress and warping analyses including one or more heuristic algorithms applied to the solid model, and excluding finite element analysis of a corresponding finite element model of the three-dimensional object, as shown in block 2106. The method includes selecting a type of support structure to place at the region so identified, with the type of support structure being selected from a plurality of types of support structure based on the stress and warping analyses so performed, as shown at block 2108. And the method includes generating a shell of the three-dimensional object based on the solid model, and including the support structure at the region so identified and of the type so selected, as shown at block 2110.

Figure 22:
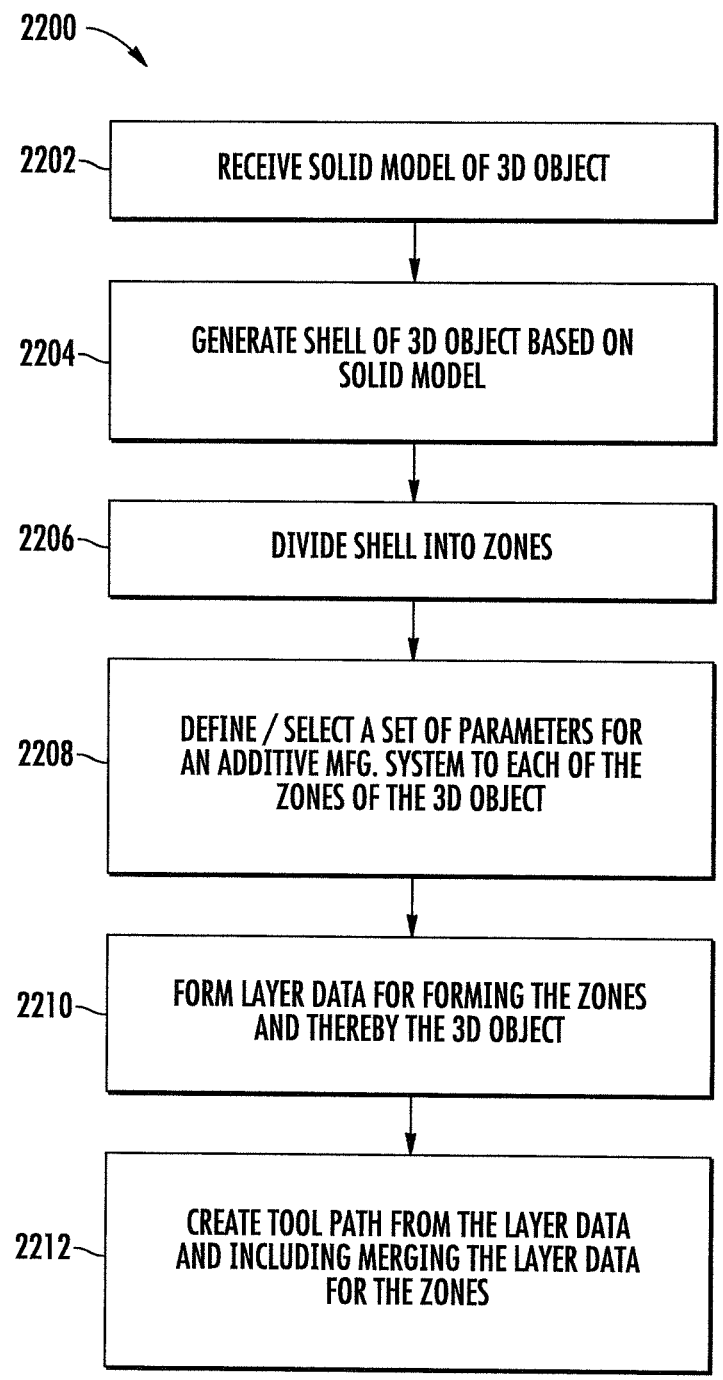
FIG. 22 illustrates various operations in a method of creating multiple zones of parameters for a three-dimensional object formed by additive manufacturing, according to some example implementations.

FIG. 22 illustrates various operations in a method 2200 of creating multiple zones of parameters for a three-dimensional object formed by additive manufacturing, according to some example implementations of the present disclosure. As shown in blocks 2202, 2204, 2206 the method includes receiving solid model of the three-dimensional object, generating a shell of the three-dimensional object based on the solid model, and dividing the shell into zones and thereby form zones of the three-dimensional object. The method includes defining or selecting a set of parameters for the additive manufacturing system to form each of the zones of the three-dimensional object, the sets of parameters being different between the zones, as shown in block 2208. The method includes forming layer data defining a plurality of layers of the shell for use in forming the zones and thereby the three-dimensional object, as shown in block 2210. And the method includes creating a tool path (e.g., a single tool path) from the layer data, and including merging the layer data for the zones, for receipt by an additive manufacturing system configured to manipulate build material to form the three-dimensional object on a layer-by-layer basis, as shown in block 2212.

Figure 23:
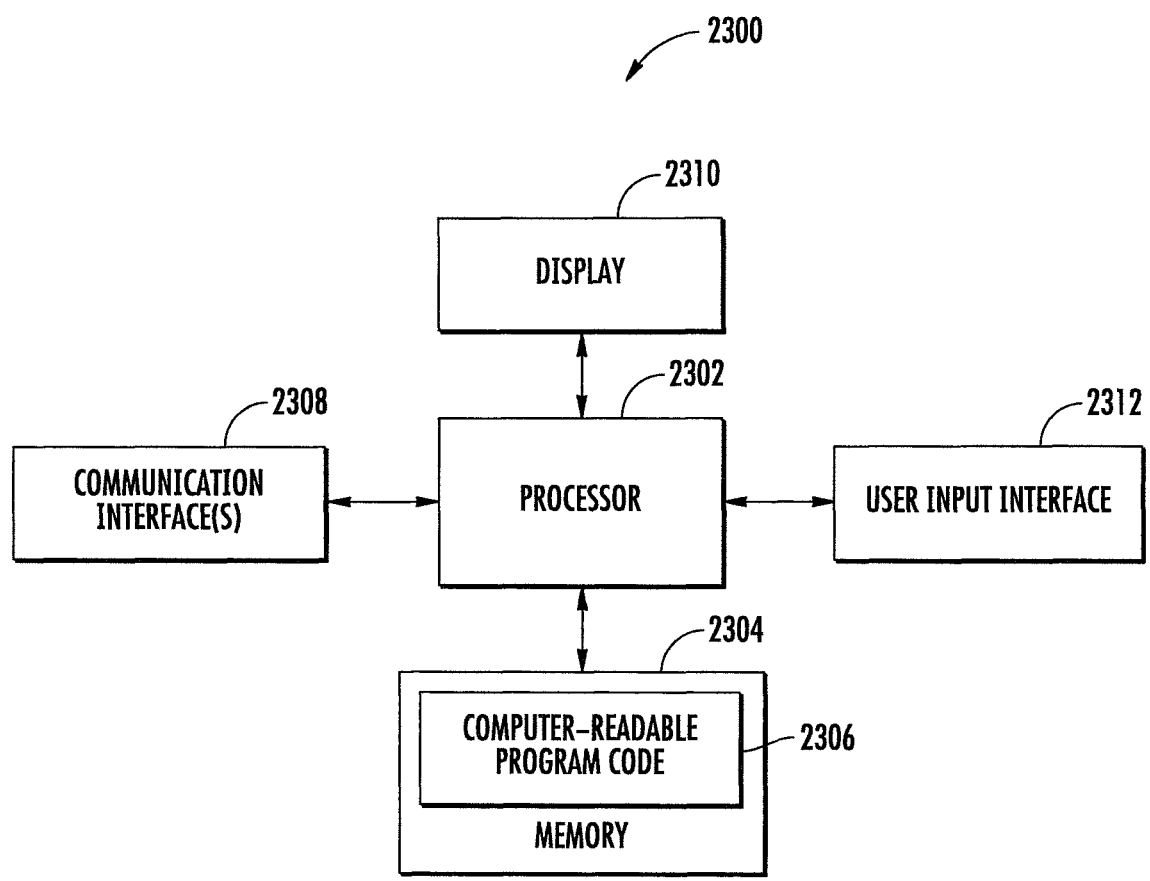
FIG. 23 illustrates an apparatus that in some examples may correspond to the computing apparatus of the system illustrated in FIG. 1.

FIG. 23 illustrates an apparatus 2300 that in some examples may correspond to the computing apparatus 102 of FIG. 1. In some examples, the apparatus may be provided by more than one apparatus connected to or otherwise in communication with one another in a number of different manners, such as directly or indirectly by wire or via a wired or wireless network or the like.

Generally, the apparatus 2300 may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor 2302 connected to a memory 2304. In this regard, the apparatus may include hardware configured to function as or otherwise implement operations according to example implementations, alone or under direction of one or more computer program code instructions, program instructions or executable computer-readable program code instructions (at times generally referred to as "computer programs," e.g., software, firmware, etc.) from a computer-readable storage medium.

The processor 2302 is generally any piece of computer hardware capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory (of the same or another apparatus).

The memory 2304 is generally any piece of computer hardware capable of storing information such as, for example, data, computer programs and/or other suitable information either on a temporary basis and/or a permanent basis. The memory may include volatile and/or non-volatile memory, and may be fixed or removable. In various instances, the memory may be referred to as a computer-readable storage medium that is non-transitory and capable of storing information, and distinguishable from computer-readable transmission media such as electronic transitory signals capable of carrying information from one location to another. Computer-readable medium as described herein generally refers to a computer-readable storage medium or computer-readable transmission medium.

In addition to the memory 2304, the processor 2302 may also be connected to one or more interfaces for displaying, transmitting and/or receiving information. The interfaces may include a communications interface 2306 and/or one or more user interfaces. The communications interface may be configured to transmit and/or receive information, such as to and/or from the apparatus 2300 and other apparatus(es), network(s) or the like. The communications interface may be configured to transmit and/or receive information by physical (wired) and/or wireless communications links.

The user interfaces may include a display 2308 and/or one or more user input interfaces 2310. The display may be configured to present or otherwise display information to a user. The user input interface may be configured to receive information from a user into the apparatus 2300, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners, additive manufacturing systems or the like.

As indicated above, program code instructions may be stored in memory (e.g., memory 2304), and executed by a processor (e.g., processor 2302), to implement functions of the computing apparatus 102 described herein. As will be appreciated, any suitable program code instructions may be loaded onto a programmable apparatus (e.g., apparatus 2300) from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. It will also be understood that one or more functions, and combinations of functions, may be implemented by special purpose hardware-based computer systems and/or processors which perform the specified functions, or combinations of special purpose hardware and program code instructions.

More information regarding aspects of example implementations of the present disclosure may be found in the Appendix hereto.

Many modifications and other implementations of the disclosure set forth herein will come to mind to one skilled in the art to which the disclosure pertains having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Moreover, although the foregoing descriptions and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for creating multiple zones of parameters for a three-dimensional object formed by additive manufacturing, the apparatus comprising a processor and a memory storing executable instructions that in response to execution by the processor cause the apparatus to at least:
    receive solid model of the three-dimensional object;
    generate a shell of the three-dimensional object based on the solid model;
    divide the shell into zones and thereby form zones of the three-dimensional object;
    define or select a set of parameters for the additive manufacturing system to form each of the zones of the three-dimensional object, the set of parameters being different between the zones;
    form layer data defining a plurality of layers of the shell for use in forming the zones and thereby the three-dimensional object; and create a tool path from the layer data, and including the apparatus being caused to merge the layer data for the zones, for receipt by an additive manufacturing system configured to manipulate build material to form the three-dimensional object on a layer-by-layer basis;

the additive manufacturing system includes a laser configured to emit a beam onto build material to form the three-dimensional object on a layer-by-layer basis, and the set of parameters include values for one or more of beam power, beam offset, laser speed, laser time delay, laser acceleration parameters, laser focus, layer thickness, hatching pattern, number of boundary or contour profiles;

the shell of the three-dimensional object is in a coordinate system with orthogonal axes including x- and y-axes, and a z-axis, and wherein the apparatus being caused to create the tool path includes being caused to one or more of (a) add continuity in the tool path for any beam offset that differs in the set of parameters between the zones, (b) include a finger joint in the tool path in the direction of the z-axis where the zones of the three-dimensional object are joined, (c) reorient the tool path layer-per-layer in the directions of the x- and/or y-axes, or (d) offset a contour endpoint of the tool path for each zone.

2. The apparatus of claim 1, wherein the apparatus being caused to (b) include the finger joint includes being caused to alternately apply an offset to the zones in the directions of the x- and/or y-axes where the zones are joined.

3. The apparatus of claim 1, wherein the apparatus being caused to (c) reorient the tool path includes being caused to reorient the tool path to thereby reorient hatch lines in the three-dimensional object formed by the additive manufacturing system.

4. The apparatus of claim 1, wherein the apparatus being caused to (d) offset the contour includes being caused to add approach and retract motions in the tool path at the contour end points of the tool path where the zones of the three-dimensional object are joined.

5. The apparatus of claim 1, wherein the apparatus being caused to divide the shell into zones includes being caused to receive user input to overlay three-dimensional volumes onto the shell, the three-dimensional volumes enclosing and thereby defining the zones of the three-dimensional object.

6. The apparatus of claim 1, wherein the zones are automatically defined based on one or more of a thermal analysis and a stress analysis.

7. A method of creating multiple zones of parameters for a three-dimensional object formed by additive manufacturing, the method comprising:

receiving solid model of the three-dimensional object;
generating a shell of the three-dimensional object based on the solid model;
dividing the shell into zones and thereby form zones of the three-dimensional object;
defining or selecting a set of parameters for the additive manufacturing system to form each of the zones of the three-dimensional object, the set of parameters being different between the zones;
forming layer data defining a plurality of layers of the shell for use in forming the zones and thereby the three-dimensional object; and
creating a tool path from the layer data, and including merging the layer data for the zones, for receipt by an additive manufacturing system configured to manipulate build material to form the three-dimensional object on a layer-by-layer basis;

the additive manufacturing system includes a laser configured to emit a beam onto build material to form the three-dimensional object on a layer-by-layer basis, and the sets of parameters include values for one or more of beam power, beam offset, laser speed, laser time delay, laser acceleration parameters, laser focus, layer thickness, hatching pattern, number of boundary or contour profiles;

the shell of the three-dimensional object is in a coordinate system with orthogonal axes including x- and y-axes, and a z-axis, and wherein creating the tool path includes one or more of (a) adding continuity in the tool path for any beam offset that differs in the set of parameters between the zones, (b) including a finger joint in the tool path in the direction of the z-axis where the zones of the three-dimensional object are joined, (c) reorienting the tool path layer-per-layer in the directions of the x- and/or y-axes, or (d) offsetting a contour endpoint of the tool path for each zone.

8. The method of claim 7, wherein (b) including the finger joint includes alternately applying an offset to the zones in the directions of the x- and/or y-axes where the zones are joined.

9. The method of claim 7, wherein (c) reorienting the tool path includes reorienting the tool path to thereby reorient hatch lines in the three-dimensional object formed by the additive manufacturing system.

10. The method of claim 7, wherein (d) offsetting the contour includes adding approach and retract motions in the tool path at the contour end points of the tool path where the zones of the three-dimensional object are joined.

11. The method of claim 7, wherein dividing the shell into zones includes receiving user input to overlay three-dimensional volumes onto the shell, the three-dimensional volumes enclosing and thereby defining the zones of the three-dimensional object.

12. The method of claim 7 wherein the zones are automatically defined based on one or more of a thermal analysis and a stress analysis.

13. A computer-readable storage medium for creating multiple zones of parameters for a three-dimensional object formed by additive manufacturing, the computer-readable storage medium being non-transitory and having computer-readable program code portions stored therein that in response to execution by a processor cause an apparatus to at least:

receive solid model of the three-dimensional object;
generate a shell of the three-dimensional object based on the solid model;
divide the shell into zones and thereby form zones of the three-dimensional object;
define or select a set of parameters for the additive manufacturing system to form each of the zones of the three-dimensional object, the set of parameters being different between the zones;
form layer data defining a plurality of layers of the shell for use in forming the zones and thereby the three-dimensional object; and
create a tool path from the layer data, and including the apparatus being caused to merge the layer data for the zones, for receipt by an additive manufacturing system configured to manipulate build material to form the three-dimensional object on a layer-by-layer basis;

the additive manufacturing system includes a laser configured to emit a beam onto build material to form the three-dimensional object on a layer-by-layer basis, and the set of parameters include values for one or more of beam power, beam offset, laser speed, laser time delay, laser acceleration parameters, laser focus, layer thickness, hatching pattern, number of boundary or contour profiles;

the shell of the three-dimensional object is in a coordinate system with orthogonal axes including x- and y-axes, and a z-axis, and wherein the apparatus being caused to create the tool path includes being caused to one or more of (a) add continuity in the tool path for any beam offset that differs in the set of parameters between the zones, (b) include a finger joint in the tool path in the direction of the z-axis where the zones of the three-dimensional object are joined, (c) reorient the tool path layer-per-layer in the directions of the x- and/or v-axes, or (d) offset a contour endpoint of the tool path for each zone.

14. The computer-readable storage medium of claim 13, wherein the apparatus being caused to (b) include the finger joint includes being caused to alternately apply an offset to the zones in the directions of the x- and/or y-axes where the zones are joined.

15. The computer-readable storage medium of claim 13, wherein the apparatus being caused to (c) reorient the tool path includes being caused to reorient the tool path to thereby reorient hatch lines in the three-dimensional object formed by the additive manufacturing system.

16. The computer-readable storage medium of claim 13, wherein the apparatus being caused to (d) offset the contour includes being caused to add approach and retract motions in the tool path at the contour end points of the tool path where the zones of the three-dimensional object are joined.

17. The computer-readable storage medium of claim 13, wherein the apparatus being caused to divide the shell into zones includes being caused to receive user input to overlay three-dimensional volumes onto the shell, the three-dimensional volumes enclosing and thereby defining the zones of the three-dimensional object.

18. The computer-readable storage medium of claim 13, wherein the zones are automatically defined based on one or more of a thermal analysis and a stress analysis.

* * * * *